US008426844B2

(12) United States Patent
Moon et al.

(10) Patent No.: US 8,426,844 B2
(45) Date of Patent: Apr. 23, 2013

(54) LIGHT EMITTING DEVICE, LIGHT EMITTING DEVICE PACKAGE, AND DISPLAY DEVICE THEREWITH

(75) Inventors: Yong Tae Moon, Seongnam-si (KR); Yong Seon Song, Yongin-si (KR); Jong hak Won, Yongin-si (KR); Jeong Sik Lee, Asan-si (KR); Jung Hun Jang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 117 days.

(21) Appl. No.: 13/178,691

(22) Filed: Jul. 8, 2011

(65) Prior Publication Data

US 2012/0033444 A1 Feb. 9, 2012

(30) Foreign Application Priority Data

| Aug. 4, 2010 | (KR) | 10-2010-0075246 |
| Aug. 4, 2010 | (KR) | 10-2010-0075247 |
| Aug. 23, 2010 | (KR) | 10-2010-0081515 |

(51) Int. Cl.
  *H01L 29/06* (2006.01)

(52) U.S. Cl.
  USPC .................................... 257/14; 257/E33.008

(58) Field of Classification Search .............. 257/13–15, 257/17, 22, 79, 94, 97, 103, E33.008
  See application file for complete search history.

(56) References Cited

U.S. PATENT DOCUMENTS 7,053,418 B2 * 5/2006 Kim et al. .................... 257/97

FOREIGN PATENT DOCUMENTS

| KR | 10-2001-0068552 A | 7/2001 |
| KR | 10-2005-0010017 A | 1/2005 |
| KR | 10-2005-0123421 A | 12/2005 |
| KR | 10-0558455 B1 | 3/2006 |
| KR | 10-0753518 B1 | 8/2007 |
| KR | 10-2008-0010136 A | 1/2008 |
| KR | 10-0826422 B1 | 4/2008 |
| KR | 10-2008-0045943 A | 5/2008 |
| KR | 10-0850950 B1 | 8/2008 |
| KR | 10-2008-0090669 A | 10/2008 |
| KR | 10-2009-0109340 A | 10/2009 |
| KR | 10-0924454 B1 | 11/2009 |
| KR | 10-2010-0027407 A | 3/2010 |

OTHER PUBLICATIONS

Korean Notice of Allowance dated Mar. 9, 2012 issued in Application No. 10-2010-0075246.

* cited by examiner

*Primary Examiner* — David Vu
(74) *Attorney, Agent, or Firm* — KED & Associates LLP

(57) ABSTRACT

A light emitting device includes an active layer having quantum walls and quantum wells, a first conductive type semiconductor layer on one side of the active layer, a second conductive type semiconductor layer on the other side of the active layer, and an interfacial layer arranged between the active layer and the first conductive type semiconductor layer or between the active layer and the second conductive type semiconductor layer, wherein the interfacial layer includes barrier layers and basal layers provided between the barrier layers, wherein an energy bandgap of each of the barrier layers increases from the first conductive type semiconductor layer or the second conductive type semiconductor layer to an active layer direction linearly, and greatest energy bandgaps of the barrier layers are different from one another.

20 Claims, 14 Drawing Sheets

LIGHT EMITTING DEVICE, LIGHT EMITTING DEVICE PACKAGE, AND DISPLAY DEVICE THEREWITH

CROSS REFERENCE TO RELATED APPLICATION

This application claims priority under 35 U.S.C. §119 to Korean Patent Application No. 10-2010-0075246, filed in Korea on Aug. 4, 2010 and 10-2010-0075247 filed in Korea on Aug. 4, 2010, and 10-2010-0081515 filed in Korea on Aug. 23, 2010 which is hereby incorporated in its entirety by reference as if fully set forth herein.

TECHNICAL FIELD

The embodiments relates to a light emitting device, a light emitting device package, and a display device therewith.

BACKGROUND

The light emitting device, such as a light emitting diode of III-V group or II-VI group compound semiconductor or a laser diode, can produce various colors, such as red, blue, and ultra-violet owing to development of the thin film growth technology and device materials therefor, as well as a white color of good efficiency by using a fluorescent material or mixing colors, and is advantageous in that the light emitting device has power consumption lower than the present light sources, such as a fluorescent light and an incandescent light, a semi-permanent lifetime, fast response speed, and safety, and is environment friendly.

Accordingly, application of the light emitting device is expanding even to transmission modules of optical communication means, a light emitting diode back light unit which is replacing CCFL (Cold Cathode Fluorescence Lamp) of the back light unit in an LCD (Liquid Crystal Display) device, white light emitting diode lighting fixtures, car head lights, and signal lamps.

SUMMARY

The embodiments are directed to a light emitting device, a light emitting device package, and a display device therewith, which can improve light emission efficiency of the light emitting device.

The light emitting device includes an active layer having quantum walls and quantum wells, a first conductive type semiconductor layer on one side of the active layer, a second conductive type semiconductor layer on the other side of the active layer, and an interfacial layer arranged between the active layer and the first conductive type semiconductor layer or between the active layer and the second conductive type semiconductor layer, wherein the interfacial layer includes barrier layers and basal layers provided between the barrier layers, wherein an energy bandgap of each of the barrier layers increases from the first conductive type semiconductor layer or the second conductive type semiconductor layer to an active layer direction linearly, and greatest energy bandgaps of the barrier layers are different from one another.

The greatest energy bandgaps of the barrier layers can be the smaller as the barrier layers are the closer to the active layer.

The greatest energy bandgap of each of the barrier layers can be greater than the energy bandgap of each of the quantum walls.

Each of the barrier layers can have a lowest point of an energy bandgap higher than an energy bandgap of each of the quantum walls.

The basal layer can be a section of the interfacial layer having a lowest energy bandgap.

The basal layer can have an energy bandgap identical or smaller than an energy bandgap of the first conductive type semiconductor layer or the second conductive type semiconductor layer.

The basal layer can have an energy bandgap greater than an energy bandgap of each of the quantum wells.

Each of the barrier layers can include a first section in which the energy bandgap increases linearly, a second section in which the greatest energy bandgap of the first section is fixedly maintained.

Each of the barrier layers can be defined from a starting point to an end point, and the energy bandgap of each of the barrier layers can increase from the starting point to the end point, linearly.

The basal layer can be positioned between the end point of one of adjacent barrier layers and the starting point of the other one of the adjacent barrier layers.

The energy bandgap can decrease from one of the end points to the basal layer adjacent thereto, vertically.

The energy bandgaps at the starting points of the barrier layers can be identical to one another.

The interfacial layer can have composition of $Al_xIn_yGa_{1-x-y}N$ (Where, $0 \leq x$, $y \leq 1$), and an aluminum content of each of the barrier layers can increase from the starting point to the end point, linearly.

The aluminum content of the barrier layer closest to the active layer can be below 10%.

Each of the barrier layers can have a thickness of 1 nm~10 nm.

The basal layer can have composition of $In_xGa_{1-x}N$ doped with p type or n type impurity.

The light emitting device can further include a substrate arranged on an underside of the first conductive type semiconductor layer, a first electrode arranged on the first conductive type semiconductor layer, and a second electrode arranged on the second conductive type semiconductor layer.

The light emitting device can further include a first electrode on the first conductive type semiconductor layer, and a second electrode arranged on an underside of the second conductive type semiconductor layer to include an ohmic layer and a reflective layer.

A light emitting device package includes a package body, a first electrode layer and a second electrode layer provided to the package body, a light emitting device connected to the first electrode layer and the second electrode layer, electrically, and a filling material for enclosing the light emitting device recited in above embodiments.

A display device includes a display panel, a backlight unit for emitting a light to the display panel, and an image signal forwarding circuit connected to the display panel for supplying an image signal thereto, wherein the backlight unit includes a bottom cover, a reflective plate arranged on the bottom cover, a light guide plate arranged on the reflective plate, a light source having light emitting device packages arranged on a substrate for emitting a light to the light guide plate, and optical sheets arranged on the light guide plate, wherein each of the light emitting device packages can include the light emitting device package recited in above embodiments.

It is to be understood that both the foregoing general description and the following detailed description of the embodiment are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Figure 1:
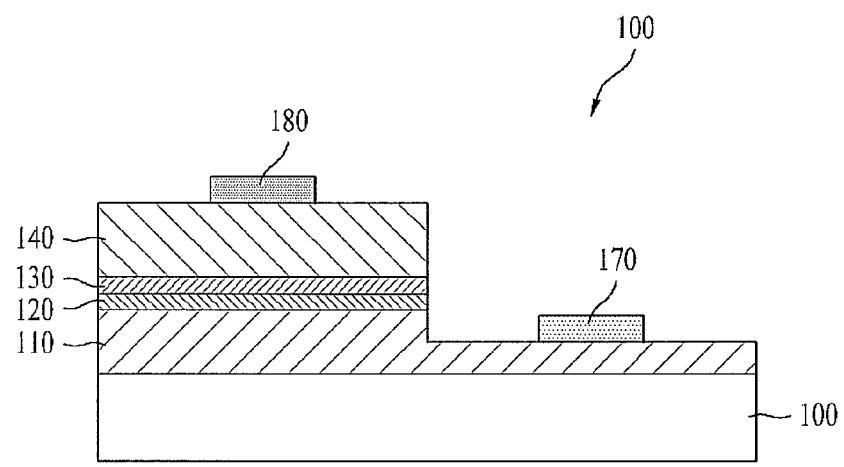
FIG. 1 illustrates a section of a light emitting device in accordance with a embodiment.

Reference will now be made in detail to the specific embodiments of the present invention, examples of which are illustrated in the accompanying drawings. Wherever possible, the same reference numbers will be used throughout the drawings to refer to the same or like parts.

In description of embodiments, if it is described that a layer (a film), a region, a pattern, or a structure is formed "on" or "under" a substrate, a layer (a film), a region, a pad, or a pattern, the "on", or "under" implies that the layer (the film), the region, the pattern, or the structure is formed "on" or "under" the substrate, the layer (the film), the region, the pad, or the pattern directly or indirectly with other substrate, layer (film), region, pad, or pattern, disposed therebetween. And, a reference on the "on" or "under" is the drawing.

A thickness or a size of a layer shown in a drawing can be exaggerated, omitted or shown schematically for convenience or clarity of description. And, a size of an element may not be shown to scale, perfectly.

Figure 2:
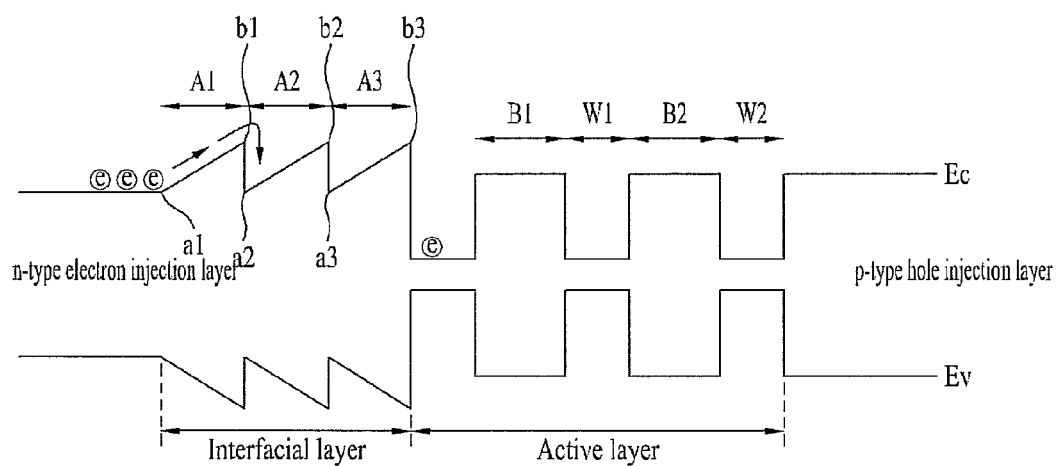
FIG. 2 illustrates a diagram of an energy band gap of the light emitting device in FIG. 1.

FIG. 1 illustrates a section of a light emitting device 100 in accordance with a embodiment, and FIG. 2 illustrates a diagram of an energy band gap of the light emitting device 100 in FIG. 1. A light emitting device 100 will be described with reference to FIGS. 1 and 2.

Referring to FIGS. 1 and 2, the light emitting device 100 includes a substrate 101, a first conductive type semiconductor layer 110, an interfacial layer 120, an active layer 130, a second conductive type semiconductor layer 140, a first electrode 170, and a second electrode 180. FIG. 2 illustrates the first conductive type semiconductor layer 110 as an n type electron injection layer, and the second conductive type semiconductor layer 140 as a p type hole injection layer.

A semiconductor layer including the first conductive type semiconductor layer 110, the interfacial layer 120, the active layer 130, and the second conductive type semiconductor layer 140 is arranged on the substrate 101. The semiconductor layer can be a nitride semiconductor.

The substrate 101 is arranged on an underside of the first conductive type semiconductor layer 110, and is formed of a light transmissive material, for an example, sapphire $Al_2O_3$, GaN, SiC, ZnO, Si, GaP, InP, $Ga_2O_3$, and GaAs.

And, there can be a buffer layer (not shown) provided between the nitride semiconductor and the substrate 101, for buffering mismatch of lattices of materials, and a difference to thermal coefficients. The buffer layer (not shown) can be formed of a GaN layer grown at a low temperature, or an AlN layer.

The first conductive type semiconductor layer 110 can be formed only of a first conductive type semiconductor layer, or can further include an undoped semiconductor layer on an underside of the first conductive type semiconductor layer, does not limit to these.

The first conductive type semiconductor layer 110 can include, for an example, an n type semiconductor layer selected from a semiconductor material having composition of $In_xAl_yGa_{1-x-y}N$ ($0 \leq x \leq 1$, $0 \leq y \leq 1$, $0 \leq x+y \leq 1$), for an example, GaN, AlN, AlGaN, InGaN, InN, InAlGaN, AlInN, and can be doped with an n type dopant, such as Si, Ge, Sn, Se, Te.

The undoped semiconductor layer, a layer formed for improving crystallinity of the first conductive type semiconductor layer, can be identical to the first conductive type semiconductor layer except that the undoped semiconductor layer has a lower electric conductivity than the first conductive type semiconductor layer as the undoped semiconductor layer has no n type dopant doped therewith.

The interfacial layer 120 can be provided on the first conductive type semiconductor layer 110. For an example, the interfacial layer 120 can be arranged between the first conductive type semiconductor layer 110 and the active layer 130.

The interfacial layer 120 can include at least one barrier layer (for an example, A1, A2 and A3), in which an energy band gap increases gradually in a direction from the first conductive type semiconductor layer 110 to the active layer 130. FIG. 2 illustrates an embodiment which includes three barrier layers A1, A2 and A3. The energy bandgap of each of the barrier layers A1, A2, A3 can increase linearly or non-linearly. In this instance, if the energy bandgap of each of the barrier layers A1, A2, A3 increases in tiers, the barrier layers A1,A2,A3 can act as a barrier for the electron difficult to overcome.

And, each of the barrier layers A1,A2,A3 is defined from a starting point (for an example, a1, a2, or a3) to an end point (for an example, b1, b2, or b3), and the energy bandgap of each of the barrier layers A1,A2, A3 can increase from the starting point (for an example, a1, a2, or a3) in a direction of the first conductive type semiconductor layer 110 to the end point (for an example, b1, b2, or b3) in a direction of the active layer 130. The end point (for an example, b1, b2, or b3) of each of the barrier layers A1,A2, A3 is closer to the active layer 130 than the starting point (for an example, a1, a2, or a3).

The energy bandgap in the interfacial layer 120 can decrease vertically from one end point (for an example, b1) of one barrier layer (for an example, A1) to one starting point (for an example, a2) of one barrier layer A2 adjacent thereto. This is because, if the energy bandgap decreases, not vertically, but moderately, from the one end point b1 of the one starting point a2 in the interfacial layer 120, a hole can be injected from the active layer 130 to the first conductive type semiconductor layer 110, to reduce light emitting efficiency.

Relations between the barrier layers A1, A2, A3 will be described, in detail.

The interfacial layer 120 can include the first to third barrier layers A1,A2, A3 adjacent to each other. For example, the first barrier layer A1, the second barrier layer A2, and the third barrier layer A3 can be the closer to the first conductive type semiconductor layer 110 in above order.

Referring to FIG. 2, the first barrier layer A1 can have the energy bandgap which increases from the first starting point a1 in a first conductive type semiconductor layer (an n type conductive type semiconductor layer) direction to the first end point b1 in an active layer 130 direction. And, the second barrier layer A2 can have the energy bandgap which increases from the second starting point a2 to the second end point b2. And, the third barrier layer A3 can have the energy bandgap which increases from the third starting point a3 to the third end point b3.

The starting points and the end points of the barrier layers adjacent to each other can be in contact. For an example, the first end point b1 and the second starting point a2 are in contact with each other, and the second end point b2 and the third starting point a3 can be in contact with each other.

The energy bandgap of the interfacial layer 120 can be reduced from the first end point b1 to the second starting point a2 vertically, and from the second end point b2 to the third starting point a3, vertically. That is, the energy bandgaps of the first to third barrier layers A1, A2, A3 can have patterns identical to one another.

And, the energy bandgaps of the first to third starting points a1, a2, a3 can be identical to one another, and the energy bandgaps of the first to third end points b1, b2, b3 can be identical to one another.

And, the energy bandgap of each of the starting points a1, a2, a3 of the first to third barrier layers A1, A2, A3 can be smaller than the energy bandgap of the first conductive type semiconductor layer 110.

Though FIG. 2 illustrates the energy bandgap of the first starting point a1 of the first barrier layer A1 identical to the energy bandgap of the first conductive type semiconductor layer 110, the embodiment is not limited to this, but the energy bandgap of the first starting point a1 of the first barrier layer A1 can be smaller than the energy bandgap of the first conductive type semiconductor layer 110.

If the energy bandgap of the first starting point a1 of the first barrier layer A1 is smaller than the energy bandgap of the first conductive type semiconductor layer 110, though emigration of the electron into the active layer 130 from the first conductive type semiconductor layer 110 can not be easy, the electron is made to proceed to the active layer 130 by making a slope of the bandgap of the first barrier layer A1 moderate.

A highest point of at least one of the energy bandgaps of the first to third barrier layers A1, A2, A3 can be higher than the energy bandgaps of quantum walls B1, B2 in the active layer 130. That is, the energy bandgap at any one of the first to third end points b1, b2, b3 can be greater than the energy bandgaps of quantum walls B1, B2.

And, a lowest point of the energy bandgaps of the first to third barrier layers A1, A2, A3 can be higher than the energy bandgaps of well layers W1, W2 in the active layer 130. That is, the energy bandgaps at the first to third starting points a1, a2, a3 can be greater than the energy bandgaps of the well layers W1, W2.

For an example, a highest point of each of the energy bandgaps of the first to third barrier layers A1,A2, A3 can be higher than the energy bandgaps of the quantum walls B1, B2 in the active layer 130. This is for the interfacial layer 120 to serve as a barrier which prevents a hole injected into the active layer 130 from the second conductive type semiconductor layer (a p-type semiconductor layer) from passing to the first conductive type semiconductor layer 110, adequately.

Each of the first to third barrier layers A1, A2, A3 can have a thickness of at least 2 nm~10 nm. That is, if each of the first to third barrier layers A1,A2, A3 has a too thin thickness, each of the first to third barrier layers A1, A2, A3 can not serve as a barrier against the hole adequately due to a tunneling effect. And, if each of the first to third barrier layers A1,A2,A3 has a too thick thickness, since each of the first to third barrier layers A1, A2, A3 can act as an obstacle even for passing of the electron, each of the first to third barrier layers A1, A2, A3 can have a thickness of below 10 nm.

Since the interfacial layer 120 having at least one barrier layer acts as an energy barrier adequately high for the hole injected into the active layer 130 from the second conductive type semiconductor layer 140, the interfacial layer 120 having at least one barrier layer can prevent the hole from proceeding to the first conductive type semiconductor layer 110.

However, since each of the first to third barrier layers A1,A2,A3 acts as a sloped energy barrier for an electron proceeding to the active layer 130 from the first conductive type semiconductor layer 110, the electron can proceed to the active layer 130 passing through the first to third barrier layers A1, A2, A3, easily.

And, an average face direction lattice constant of the first to third barrier layers A1,A2,A3 can be greater than the face direction lattice constant of the quantum walls B1, B2 in the active layer 130. That is, if the face direction lattice constant of the interfacial layer 120 is greater than the face direction lattice constant of the quantum walls B1, B2 such that the interfacial layer 120 reduces a compression stress at the quantum walls B1, B2 in the active layer 130 to increase a probability of recombination of the electron and the hole to emit a light, light emitting efficiency can increase.

In detail, the interfacial layer 120 can have composition of $Al_xIn_yGa_{1-x-y}N$ (Where, $0 \leq x, y \leq 1$). In order to make the interfacial layer 120 to have the energy bandgap, an aluminum (Al) content of each of the first to third barrier layers A1, A2, A3 can increase the more gradually as the first to third barrier layers A1, A2, A3 go from the first conductive type semiconductor layer 110 to the active layer 130 the more, and an In content of each of the first to third barrier layers A1, A2, A3 can decrease the more gradually as the first to third barrier layers A1, A2, A3 go from the first conductive type semiconductor layer 110 to the active layer 130 the more.

And, the active layer 130 can be formed on the interfacial layer 120. The active layer 130 can include, for an example, a semiconductor material having composition of $In_xAl_yGa_{1-x-y}N$ ($0 \leq x \leq 1, 0 \leq y \leq 1, 0 \leq +y \leq 1$), and can include at least one selected from a quantum wire structure, a quantum dot structure, a single quantum well structure, and a multi quantum well structure MQW.

The active layer 130 can emit a light with energy generated in a process of recombination of an electron and a hole provided from the first conductive semiconductor layer 110 and the second conductive type semiconductor layer 140 described, later.

The second conductive type semiconductor layer 140 can be formed on the active layer 130. The second conductive type semiconductor layer 140 can be, for an example, a p type semiconductor layer selected from a semiconductor material having composition of $In_xAl_yGa_{1-x-y}N$ ($0 \leq x \leq 1, 0 \leq y \leq 1, 0 \leq x+y \leq 1$), for an example, GaN, AlN, AlGaN, InGaN, InN, InAlGaN, AlInN, and can be doped with a p type dopant, such as Mg, Zn, Ca, Sr, Ba.

Different from above, the first conductive type semiconductor layer 110 can include the p type semiconductor layer, and the second conductive type semiconductor layer 140 can include the n type semiconductor layer. And, a third conductive type semiconductor layer (not shown) including an n type or a p type semiconductor layer can be formed on the first semiconductor layer 110, enabling the light emitting device 100 of the embodiment to have at least one of np, pn, npn, and pnp junction structure.

And, a doping concentration of conductive type dopant in the first conductive type semiconductor layer 110 and the second conductive type semiconductor layer 140 may or may not be uniform. That is, the plurality of the semiconductor layers can have a variety of structures, and the present invention does not limit the structures.

The first electrode 170 is arranged on the first conductive type semiconductor layer 110, and the second electrode 180 is provided to the second conductive type semiconductor layer 140. For an example, the second conductive type semiconductor layer, the active layer, the interfacial layer, and a portion of the first conductive type semiconductor layer can be etched so as to expose a portion of the first conductive type semiconductor layer 110. And, the first electrode 170 is arranged on the first conductive type semiconductor layer exposed thus, and the second electrode 180 can be arranged on the second conductive type semiconductor layer 140.

Each of the first electrode 170 and the second electrode 180 can be a single layer or multiple layer of at least one of aluminum Al, titanium Ti, chromium Cr, nickel Ni, copper Cu, and gold Au.

Though a horizontal type light emitting device had been described up to now, the interfacial layer 120 having first to third barrier layers A1, A2, A3 can exist between the first conductive type semiconductor layer 110 and the active layer 130, which will be described later.

Figure 3:
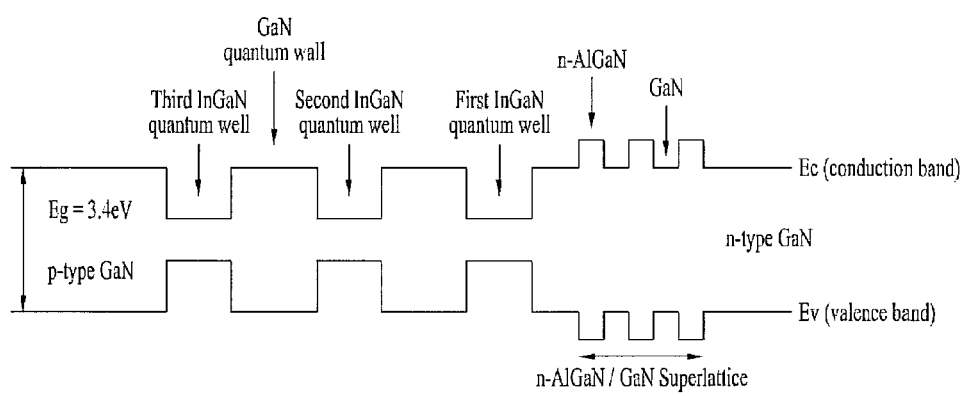
FIGS. 3 and 4 illustrate diagrams of energy band gaps of general light emitting devices, respectively.
Figure 4:
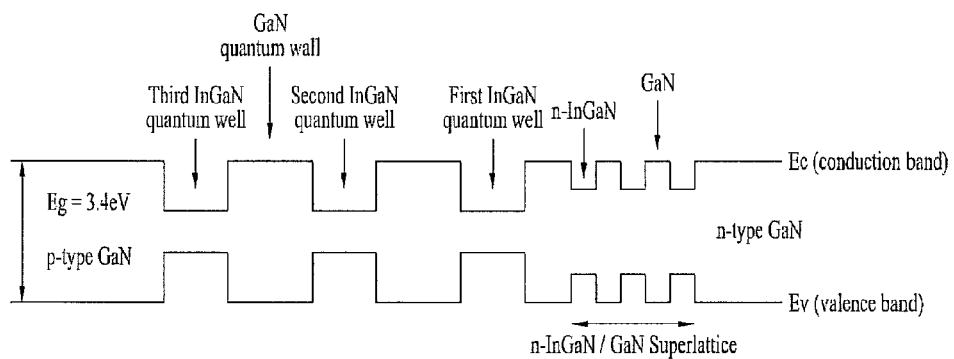

FIGS. 3 and 4 illustrate diagrams of energy band gaps of general light emitting devices, respectively.

An effect of the light emitting device of the embodiment illustrated in FIG. 1 will be described in comparison to the energy band gaps of the general light emitting devices in FIGS. 3 and 4.

Each of the light emitting devices in FIGS. 3 and 4 has a superlattice layer between the first conductive type semiconductor layer and the active layer. The superlattice layer has a superlattice structure in which an n-AlGaN/GaN superlattice is stacked repeatedly as shown in FIG. 3, or an n-InGaN/GaN superlattice is stacked repeatedly as shown in FIG. 4.

Referring to FIG. 3, because the energy bandgap of an n-AlGaN is greater than the energy bandgap of a GaN, the n-AlGaN/GaN superlattice structure can perform a blocking function against a reverse direction leakage current from the active layer to a first conductive type semiconductor layer (an n-type GaN) direction at the time of application of a reverse direction voltage to the light emitting device. However, since the superlattice layer structure in FIG. 3 makes a forward direction electron injection from an electron injecting n-GaN layer to an inside of the active layer difficult at the time of application of the forward direction voltage application, and the face direction lattice constant of the AlGaN is smaller than the lattice constant of the GaN, to cause a compression stress at the active layer, the light emitting efficiency of the light emitting device become poor.

Referring to FIG. 4, since the energy bandgap of an n-InGaN is smaller than the energy bandgap of an n-GaN, the n-InGaN/GaN superlattice structure can increase forward direction electron injection efficiency from the electron injecting n-GaN layer to the active layer at the time of application of the forward direction voltage to the light emitting device. Moreover, since the n-InGaN/GaN superlattice structure has the face direction lattice constant of the n-InGaN greater than the face direction lattice constant of the n-GaN, the n-InGaN/GaN superlattice structure can buffer the compression stress at the InGaN quantum well in the active layer. However, the n-InGaN/GaN superlattice structure can increase a reverse direction leakage current from the active layer to an electron injecting n-GaN direction at the time of application of the reverse direction voltage application to the light emitting device.

However, in the light emitting device of the embodiment disclosed in FIG. 2, the interfacial layer 120 having the barrier layers A1, A2, A3 each with the sloped energy bandgap can increase the forward direction electron injection efficiency while blocking the reverse direction leakage current, effectively.

That is, in the embodiment disclosed in FIG. 2, a large amount of forward direction electrons injected in a direction from the first conductive type semiconductor layer 110 to the active layer 130 meet the barrier layer 120 before the forward direction electrons reach to the active layer 130. Since each of the barrier layers A1, A2, A3 in the interfacial layer 120 has an energy bandgap of a gradually increased slope, the forward direction electrons can be injected to the active layer 130 passed through the barrier layers A1, A2, A3, easily.

And, at the time of application of the reverse direction voltage, the reverse electron leakage of a small amount of electrons in the quantum wells W1, W2 can be blocked. This is because the energy bandgap of the third end point b3 of the third barrier layer A3 is relatively greater than the energy bandgap of the quantum walls B1, B2 of the active layer 130.

At the end, the light emitting device 100 having plurality of barrier layers each having the energy bandgap which increases gradually in an active layer direction can block the reverse direction leakage current while making smooth forward direction current injection.

The embodiment disclosed in FIGS. 1 and 2 describes the interfacial layer 120 distinctive from the active layer 130, but not limited to this. The interfacial layer can be a portion of the active layer.

Figure 5:
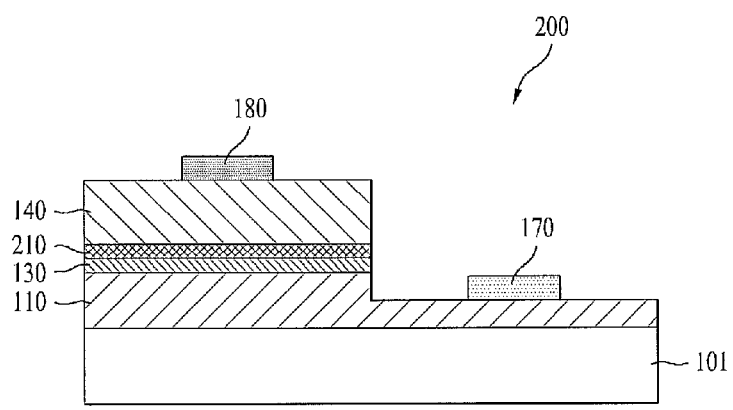
FIG. 5 illustrates a section of a light emitting device in accordance with another embodiment.
Figure 6:
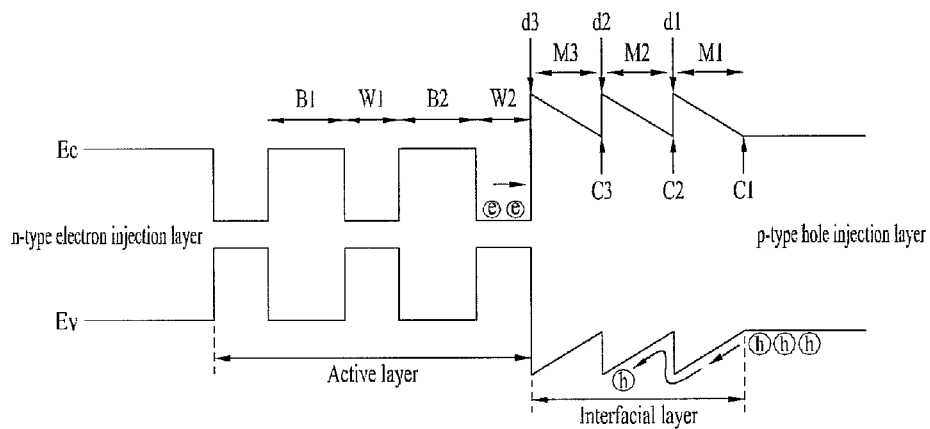
FIG. 6 illustrates a diagram of an energy band gap of the light emitting device in FIG. 5.

FIG. 5 illustrates a section of a light emitting device 200 in accordance with another embodiment, and FIG. 6 illustrates a diagram of an energy band gap of the light emitting device 200 in FIG. 5. Parts identical to the embodiment disclosed in FIGS. 1 and 2 will have identical reference symbols, and repetitive description thereof will be omitted.

The light emitting device 200 will be described with reference to FIGS. 5 and 6. Referring to FIGS. 5 and 6, the light emitting device 200 includes a substrate 101, a first conductive type semiconductor layer 110, an active layer 130, an interfacial layer 210, a second conductive type semiconductor layer 140, a first electrode 170, and a second electrode 180. In this instance, the first conductive type semiconductor layer 110, the active layer 130, the interfacial layer 210, and the second conductive type semiconductor layer 140 can be stacked on the substrate 101, in succession.

The interfacial layer 210 can be arranged between the active layer 130, and the first conductive type semiconductor layer 110. The interfacial layer 210 can include at least one barrier layer (for an example, M1, M2 and M3), in which an energy band gap increases gradually in a direction from the second conductive type semiconductor layer 140 to the active layer 130. FIG. 6 illustrates an embodiment which suggests the interfacial layer 210 having first to third barrier layers M1,M2,M3. If the energy bandgap of each of the barrier layers M1,M2,M3 increases in tiers, the barrier layers M1,M2,M3 can act as a barrier for a hole difficult to overcome.

And, the energy bandgap of each of the barrier layers M1,M2,M3 can increase from the starting point (for an example, c1, c2, or c3) in a direction of the second conductive type semiconductor layer 140 to the end point (for an example, d1, d2, or d3) in a direction of the active layer 130, gradually. The energy bandgap of the interfacial layer 210 can decrease vertically from one end point (for an example, d1) of one barrier layer (for an example, M1) to one starting point (for an example, c2) of one barrier layer M2 adjacent thereto. This is because, if the energy bandgap decreases, not vertically, but moderately, from the one end point d1 of the one starting point c2 of the interfacial layer 210, an electron can immigrate from an active layer 130 direction to the second conductive type semiconductor layer 140, to reduce light emitting efficiency.

Relations between the barrier layers M1,M2,M3 will be described, in detail.

The interfacial layer 210 can include the first to third barrier layers M1,M2,M3 adjacent to each other. The first barrier layer M1, the second barrier layer M2, and the third barrier layer M3 can be the closer to the second conductive type semiconductor layer 140 in above order.

The energy bandgaps of the barrier layers M1,M2,M3 can increase linearly, or non-linearly, respectively. As shown in FIG. 6, the first barrier layer M1 can have an energy bandgap which increases from the first starting point c1 in a second conductive type semiconductor layer (a p type conductive type semiconductor layer) direction to the first end point d1 in an active layer 130 direction. And, the second barrier layer M2 can have an energy bandgap which increases from the second starting point c2 to the second end point d2. And, the third barrier layer M3 can have an energy bandgap which increases from the third starting point c3 to the third end point d3.

The starting points and the end points of the barrier layers adjacent to each other can be in contact. For an example, the first end point d1 and the second starting point c2 are in contact with each other, and the second end point d2 and the third starting point c3 are in contact with each other.

The energy bandgap of the interfacial layer 210 can be reduced from the first end point d1 to the second starting point c2 vertically, and from the second end point d2 to the third starting point c3, vertically. That is, the energy bandgaps of the first to third barrier layers M1,M2,M3 can have patterns identical to one another.

And, the energy bandgaps of the first to third starting points c1 to c3 can be identical to one another, and the energy bandgaps of the first to third end points d1 to d3 can be identical to one another.

And, the energy bandgap of each of the starting points c1, c2, c3 of the first to third barrier layers M1,M2,M3 can be smaller than the energy bandgap of the second conductive type semiconductor layer 140.

Though FIG. 6 illustrates the energy bandgap of the first starting point c1 of the first barrier layer M1 identical to the energy bandgap of the second conductive type semiconductor layer 140, the embodiment is not limited to this, but the energy bandgap of the first starting point c1 of the first barrier layer M1 can be smaller than the energy bandgap of the second conductive type semiconductor layer 140.

If the energy bandgap of the first starting point c1 of the first barrier layer M1 is smaller than the energy bandgap of the second conductive type semiconductor layer 140, though emigration of the hole into the active layer 130 from the second conductive type semiconductor layer 140 can not be easy, the hole can be made to proceed to the active layer 130 from the second conductive type semiconductor layer 140 by making a slope of the bandgap of the first barrier layer M1 moderate.

A highest point of at least one of the energy bandgaps of the first to third barrier layers M1,M2,M3 can be higher than the energy bandgaps of quantum walls B1, B2 in the active layer 130. That is, the energy bandgap at any one of the first to third end points d1 to d3 can be greater than the energy bandgaps of quantum walls B1, B2. And, a lowest point of the energy bandgaps of the first to third barrier layers M1,M2,M3 can be higher than the energy bandgaps of well layers W1, W2 in the active layer 130. That is, the energy bandgaps at the first to third starting points c1 to c3 can be greater than the energy bandgaps of the well layers W1, W2.

For an example, the highest points of the energy bandgaps of the first to third barrier layers M1,M2,M3 can be higher than the energy bandgaps of the quantum walls B1, B2 in the active layer 130. This is for the interfacial layer 210 to serve as an electron blocking layer to prevent an electron injected into the active layer 130 from the first conductive type semiconductor layer (a p-type semiconductor layer 110) from passing to the second conductive type semiconductor layer 140, adequately.

Each of the first to third barrier layers M1,M2,M3 can have a thickness of at least 2 nm~10 nm. This is because, if each of the first to third barrier layers M1,M2,M3 has a too thin thickness, each of the first to third barrier layers M1,M2,M3 can not serve as a barrier against the electron adequately due to a tunneling effect. And, if each of the first to third barrier layers M1,M2,M3 has a too thick thickness, since each of the first to third barrier layers M1,M2,M3 can act as an obstacle even for passing of the hole, each of the first to third barrier layers M1,M2,M3 can have a thickness of below 10 nm.

Since the interfacial layer 210 having at least one barrier layer acts as an energy barrier adequately high for the electron injected into the active layer 130 from the first conductive type semiconductor layer 110, the interfacial layer 210 having at least one barrier layer can prevent the electron from proceeding to the second conductive type semiconductor layer 140.

However, since each of the first to third barrier layers M1,M2,M3 acts as a sloped energy barrier for a hole proceeding to the active layer 130 from the second conductive type semiconductor layer 140, the hole can proceed to the active layer 130 passing through the first to third barrier layers M1,M2,M3, easily.

In detail, the interfacial layer 210 can have composition of $Al_xIn_yGa_{1-x-y}N$ (Where, $0 \leq x, y \leq 1$). In order to make the interfacial layer 210 to have the energy bandgap, an Al content of each of the first to third barrier layers M1,M2,M3 can increase gradually the more as each the first to third barrier layers M1,M2,M3 goes from the starting point to the end point the more, and an In content of each of the first to third barrier layers M1,M2,M3 can decrease gradually the more as each the first to third barrier layers M1,M2,M3 goes from the starting point to the end point the more.

Figure 7:
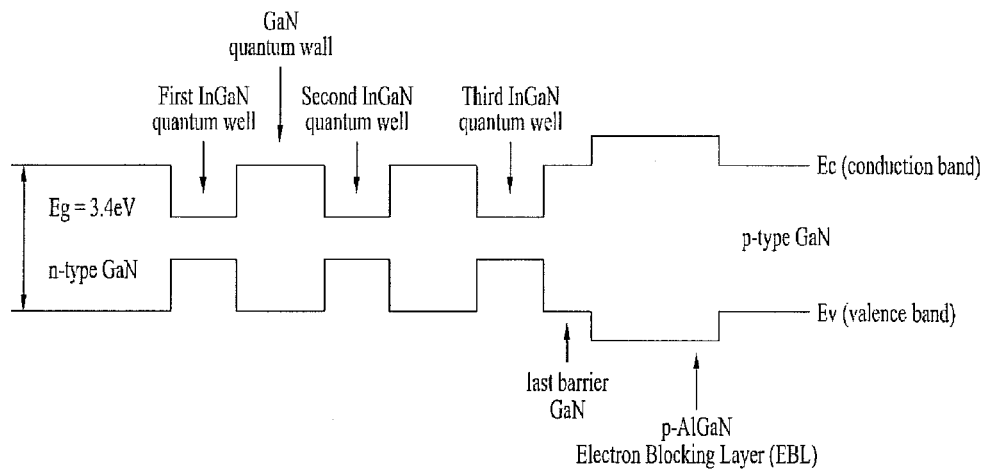
FIGS. 7 and 8 illustrate diagrams of energy band gaps of general light emitting devices, respectively.
Figure 8:
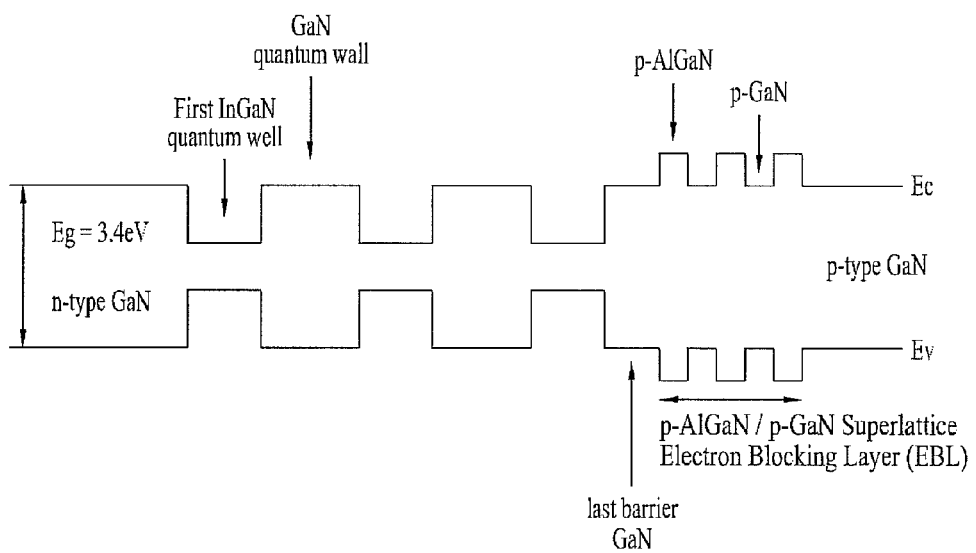

FIGS. 7 and 8 illustrate diagrams of energy band gaps of general light emitting devices, respectively.

An effect of the light emitting device 200 will be described with reference to FIGS. 7 and 8.

Referring to FIGS. 7 and 8, the light emitting device 200 can include an electron blocking layer EBL between the active layer and the p type GaN. As shown in FIG. 7, the electron blocking layer EBL can have an energy bandgap greater than a last GaN quantum wall of the active layer having a multi-quantum well structure.

However, if the electron blocking layer EBL is thin, the electron can pass to the p type GaN from the active layer by quantum-mechanical tunneling. Therefore, though formation of a thick electron blocking layer EBL can be considered in order to prevent the tunneling of the electron from taking place, the thick electron blocking layer EBL can act as an energy barrier even for the hole proceeding from the p type semiconductor layer to the active layer to make hole injection efficiency poor, thereby reducing the light emitting efficiency.

Or, referring to FIG. 8, the electron blocking layer EBL can have the superlattice structure in which p-AlGaN/p-GaN is stacked repeatedly.

However, since the p-AlGaN layer is thin to enable to increase hole injection efficiency as the holes injected to the active layer from the p conductive type semiconductor layer pass the superlattice layer by the quantum-mechanical tunneling, the electron can leak from the active layer to the P type GaN by the quantum-mechanical tunneling, to reduce the light emitting efficiency.

However, the light emitting device 200 can make smooth forward direction hole injection owing to the interfacial layer 210 having at least one time of barrier layer with the sloped energy bandgap, and can make effective blocking of the electron leakage from the active layer 130 to the second conductive type semiconductor layer 140.

That is, according to the embodiment in FIG. 6, a large amount of forward direction holes injected from the second conductive type semiconductor layer 140 to the active layer 130 meet the barrier layer 120 before the forward direction holes reach to the active layer 130. Since each of the barrier layers M1,M2,M3 in the interfacial layer 120 has an energy bandgap of gradually increasing, the forward direction holes can be injected to the active layer 130 passed through the barrier layers M1,M2,M3, easily.

In the meantime, the forward direction electron leakage of a small amount of electrons in the quantum wells W1, W2 in the active layer 130 can be blocked. This is because the energy bandgap of the third end point d3 of the third barrier layer M3 is relatively greater than the energy bandgap of the quantum walls B1, B2 of the active layer 130.

The embodiment disclosed in FIGS. 5 and 6 describes the interfacial layer 120 distinctive from the active layer 130, but not limited to this. The interfacial layer can be a portion of the active layer.

Figure 10:
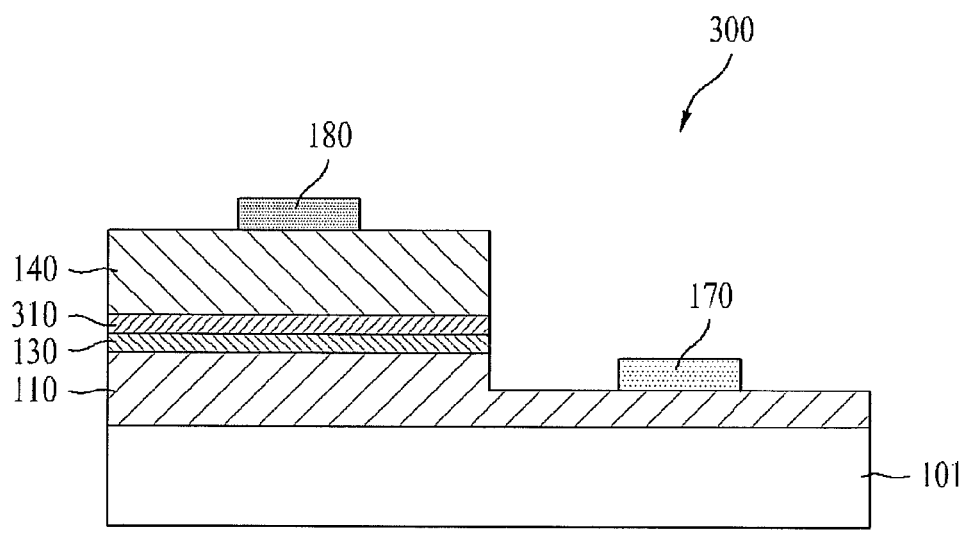
FIG. 10 illustrates a section of a light emitting device in accordance with another embodiment.
Figure 11:
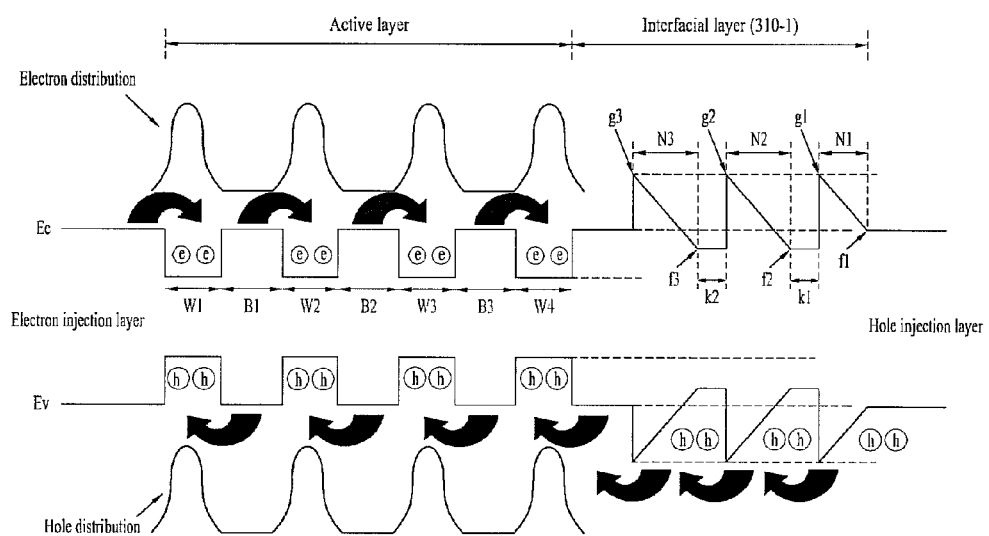
FIG. 11 illustrates a diagram of an energy bandgap of the light emitting device in FIG. 10 in accordance with a embodiment.

FIG. 10 illustrates a section of a light emitting device 300 in accordance with another embodiment, and FIG. 11 illustrates a diagram of an energy band gap of the light emitting device 300 in FIG. 10. Parts identical to the embodiment disclosed in FIGS. 1 and 2 will have identical reference symbols, and repetitive description thereof will be omitted.

Referring to FIGS. 10 and 11, the light emitting device 300 includes a substrate 101, a first conductive type semiconductor layer 110, an active layer 130, an interfacial layer 310, a second conductive type semiconductor layer 140, a first electrode 170, and a second electrode 180. In order to make distinctive, the interfacial layer having the energy bandgap shown in FIG. 11 will have a reference numeral of "310-1".

The interfacial layer 310-1 can be arranged between the active layer 130, and the second conductive type semiconductor layer 140.

The interfacial layer 310-1 can include at least two barrier layers (N1 to Nn, n is a natural numeral greater than 1), and basal layers (For an example, k1, k2) provided between the barrier layers (N1 to Nn, for an example, n=3). The interfacial layer 310-1 in FIG. 11 includes three barrier layers N1,N2,N3 and two basal layers k1 and k2.

Each of the basal layers k1 and k2 is provided between adjacent barrier layers (N1 and N2, N2 and N3), has a fixed energy bandgap, and can have a smallest energy bandgap within the interfacial layer 310-1.

The basal layers k1 and k2 can have composition of $In_xGa_{1-x}N$, where x can be a value greater than 0 and smaller than 1. The basal layers k1 and k2 can be doped with p type impurity, such as magnesium. Since the basal layers k1 and k2 are provided for making smooth emigration of the hole injected to the active layer 130 from the second conductive type semiconductor layer 140, the energy bandgap of each of the barrier layers can have a section greater than 1 nm. That is, each of the basal layers k1 and k2 can have a thickness greater than 1 nm. A small amount of aluminum can be added to the basal layers k1 and k2.

The energy bandgap of each of the barrier layers N1,N2,N3 can increase from the second conductive type semiconductor layer 140 to the active layer 130, linearly, or non-linearly. And, the energy bandgap of each of the barrier layers N1,N2, N3 can increase from a starting point f1, f2, or f3 in a second conductive type semiconductor layer 140 direction to an end point g1, g2, or g3 in an active layer 130 direction. The energy bandgap of the interfacial layer 310-1 can reduce from the end point g1, g2, or g3 to the basal layer, vertically. The end points of the barrier layers N1,N2,N3 can be closer to the active layer 130 than the starting points, respectively.

In detail, the interfacial layer 310-1 can include the first to third barrier layers N1,N2,N3, and the first basal layer k1 and the second basal layer k2.

In this instance, the first barrier layer N1 can have the energy bandgap linearly increasing from the first starting point f1 to the first end point g1. Though the first end point g1 of the first barrier layer N1 is in contact with the first basal layer k1, the energy bandgap can decrease from the first end point g1 to the starting point of the first basal layer k1, vertically. The first basal layer k1 can be provided between the first end point g1 of the first barrier layer N1 and the second starting point f2 of the second barrier layer N2, and the end point of the first basal layer k1 can be in contact with the second starting point f2 of the second barrier layer N2.

The second barrier layer N2 can have the energy bandgap linearly increasing from the second starting point f2 to the second end point g2. Though the second end point g2 is in contact with the starting point of the second basal layer k2, the energy bandgap can decrease from the second end point g2 to the starting point of the second basal layer k2, vertically. The second basal layer k2 can be provided between the second end point g2 of the second barrier layer N2 and the third starting point f3 of the third barrier layer N3, and the end point of the second basal layer k2 can be in contact with the third starting point f3 of the third barrier layer N3.

The third barrier layer N3 can have the energy bandgap increasing from the third starting point f3 to the third end point g3, linearly.

The energy bandgaps of the first to third barrier layers N1,N2,N3 can have patterns identical to one another. And, the energy bandgaps of the interfacial layer 310-1 at the first to third starting points f1 to f3 can be identical to one another, and the energy bandgaps of the interfacial layer 310-1 at the first to third end points f1 to f3 can be identical to one another.

And, the energy bandgap at each of the basal layers k1 and k2 can be smaller than the energy bandgap of the second conductive type semiconductor layer 140.

The interfacial layer 310-1 having a sloped structure for the hole to enable emigration passing therethrough, and a vertical structure for the electron difficult to immigrate has a thickness greater than 2 nm, and composition of $Al_xIn_yGa_{1-x-y}N$ (Where, $0 \leq x,y \leq 1$).

If each of the first to third barrier layers N1,N2,N3 has a too thin thickness, each of the first to third barrier layers N1,N2, N3 can not serve as a barrier against the electron adequately due to a tunneling effect. And, if each of the first to third barrier layers N1,N2,N3 has a too thick thickness, since each of the first to third barrier layers N1,N2,N3 can act as an obstacle even for passing of the hole, each of the first to third barrier layers N1,N2,N3 can have a thickness of below 10 nm.

An aluminum content of each of the barrier layers N1,N2, N3 can increase from the starting point to the end point within 30% of composition, and an In content of each of the barrier layers N1,N2,N3 can decrease from the starting point to the end point.

The energy bandgap at the first starting point f1 of the first barrier layer N1 in FIG. 11 can be identical or smaller than the energy bandgap of the second conductive type semiconductor layer 140.

This is because, if the energy bandgap of the first barrier layer N1 at the first starting point f1 is greater than the energy bandgap of the second conductive type semiconductor layer 140, the first barrier layer N1 can act as a barrier against emigration of the hole from the second conductive type semiconductor layer 140 to the active layer 130.

And, the energy bandgap of each of the end points g1, g2, g3 of the barrier layers N1,N2,N3 can be greater than the energy bandgaps of the quantum walls B1 to B3 of the active layer 130. This is because, if the energy bandgap of each of the end points g1, g2, g3 of the barrier layers N1,N2,N3 is smaller than the energy bandgaps of the quantum walls B1 to B3 of the active layer 130, the barrier layers N1,N2,N3 can fail to block the electron passing from the active layer 130 to the second conductive type semiconductor layer 140.

Figure 12:
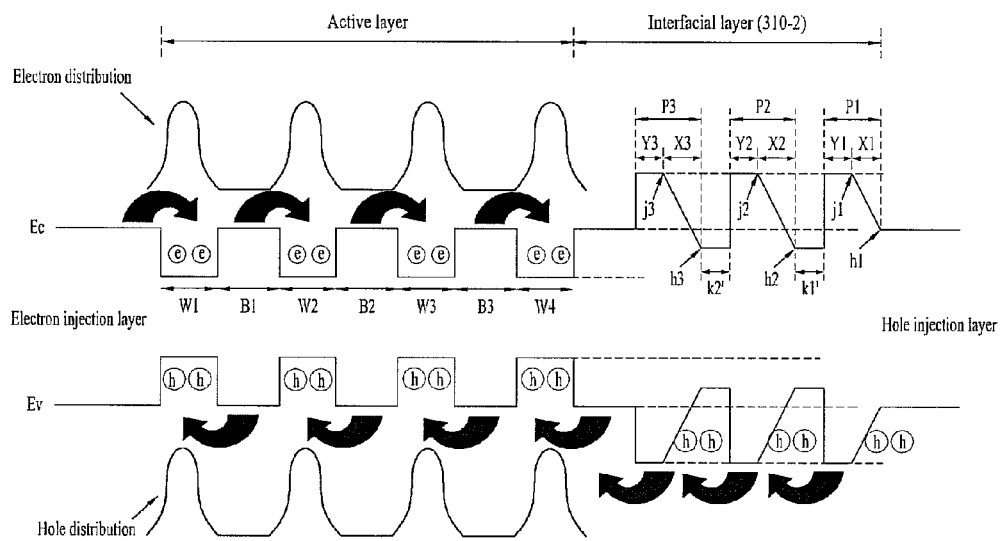
FIG. 12 illustrates a diagram of an energy bandgap of the light emitting device in FIG. 10 in accordance with another embodiment.

FIG. 12 illustrates a diagram of an energy band gap of the light emitting device 300 in FIG. 10 in accordance with another embodiment. Parts identical to the embodiment disclosed in FIGS. 1 and 2 will have identical reference symbols, and repetitive description thereof will be omitted. In order to make distinctive from other embodiments, the interfacial layer having the energy bandgap shown in FIG. 12 is given a reference numeral of 310-2.

Referring to FIGS. 10 and 12, the interfacial layer 310-2 can have two or more than two barrier layers (P1 to Pn, where n is a natural numeral greater than 1), and basal layers k1' and k2' arranged between adjacent barrier layers (P1 and P2, p2 and P3).

Each of the barrier layers (P1 to Pn, for an example, n=3) includes a first section x1, x2, or x3 and a second section y1, y2, or y3. For an example, the first barrier layer P1 can include a first section x1 and a second y1 section.

The first section x1, x2, or x3 can be a section in which the energy bandgap increases from a starting point h1, h2, or h3 to an end point j1, j2, or j3 of the barrier layer P1, p2, or P3, linearly or non-linearly, and the second section y1, y2, or y3 can be a section in which the energy bandgap at the end point j1, j2, or j3 is fixedly maintained.

The energy bandgap at the end point j1, j2, or j3 of the barrier layer P1, p2, or P3 shown in FIG. 12 can be smaller than the energy bandgap at the end point g1, g2, or g3 of the barrier layer N1, n2, or N3. Therefore, in comparison to the embodiment illustrated in FIG. 11, a greatest energy bandgap of the barrier layer P1, p2, or P3 in the interfacial layer 310-2 can be relatively small.

Accordingly, though the interfacial layer 310-2 in FIG. 12 acts as a vertical barrier against the electron injected into the active layer 130 from the first conductive type semiconductor layer 110, the interfacial layer 310-2 can increase mobility of the hole emigrating from the second conductive type semiconductor layer 140 to the active layer 130 owing to the greatest energy bandgap of each of the barrier layers which is relatively smaller than the embodiment in FIG. 11 for the hole.

Figure 13:
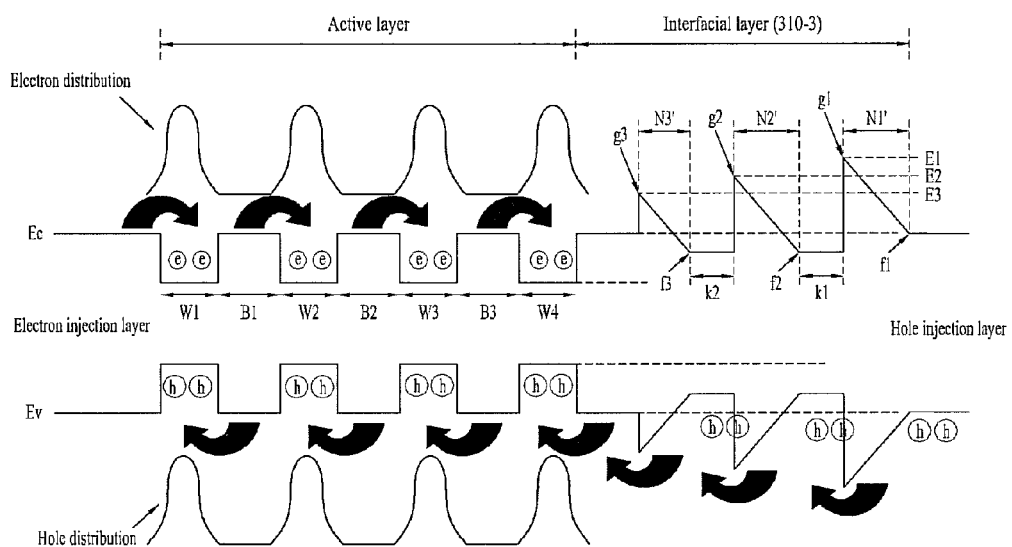
FIG. 13 illustrates a diagram of an energy bandgap of the light emitting device in FIG. 10 in accordance with another embodiment.

FIG. 13 illustrates a diagram of an energy band gap of the light emitting device 300 in FIG. 10 in accordance with another embodiment. Parts identical to the embodiment disclosed in FIGS. 1 and 2 will have identical reference symbols, and repetitive description thereof will be omitted. In order to make distinctive from other embodiments, the interfacial layer having the energy bandgap shown in FIG. 13 is given a reference numeral of "310-3".

Though the interfacial layer 310-3 is similar to the interfacial layer 310-1, greatest energy bandgaps of the barrier layer N1', N2', or N3' are different from one another, and the greatest energy bandgaps become the smaller as the barrier layer N1', N2', or N3' are the closer to the active layer 130.

The barrier layer N1', N2', or N3' is defined from a starting point, for an example, f1, f2, or f3 to an end point, for an example, g1, g2, or g3, and the energy bandgap of the barrier layer N1', N2', or N3' can increase gradually from the starting point, for an example, f1, f2, or f3 to the end point, for an example, g1, g2, or g3. The end point, for an example, g1, g2, or g3 of the barrier layer N1', N2', or N3' is closer to the active layer 130 than the starting point f1, f2, or f3. And, the energy bandgaps at the end points g1, g2, g3 of the barrier layers N1', N2', N3' can be the smaller as the end points g1, g2, g3 are the closer to the active layer 130.

The interfacial layer 310-3 includes the plurality of barrier layers N1', N2', N3' and basal layers k1, k2 arranged between adjacent barrier layers. The basal layers k1, k2 can be sections each having the lowest energy bandgap, and the energy bandgaps of the basal layers k1, k2 can be the same with each other, but not limited to this.

For example, the first barrier layer N1', the second barrier layer N2', and the third barrier layer N3' can be the closer to the hole injection layer in above order. Each of the barrier layers N1',N2',N3' can have the energy bandgap increasing linearly, or non-linearly.

The energy bandgaps of the interfacial layer 310-3 can be the smaller as the end points are the closer to the active layer 130. For an example, the energy bandgap at the second end point g2 can be smaller than the energy bandgap at the first end point g1, and the energy bandgap at the third end point g3 can be smaller than the energy bandgap at the second end point g2.

And, the energy bandgaps at the starting points f1, f2, f3 of the barrier layers N1',N2',N3' can be the same with one another, but not limited to this.

And, the energy bandgap at each of the starting points f1, f2, f3 of the barrier layers N1',N2',N3' can be smaller than the energy bandgap of a hole injection layer.

The energy bandgap of each of the end points g1, g2, g3 of the barrier layers N1',N2', N3' can be greater than the energy bandgaps of the quantum walls B1,B2, B3 of the active layer 130.

A lowest point of the energy bandgap of each of the barrier layers N1',N2', N3' can be greater than the energy bandgap of the wells W1 to W4 of the active layer 130. That is, the energy bandgap at each of the starting points f1, f2, f3 of the barrier layers N1',N2, N3' can be greater than the energy bandgap of the well layers W1 to W4.

The energy bandgap of the interfacial layer 310-3 can decrease from one end point (For an example, g1) of one barrier layer (For an example, N1') to the basal layers k1, or k2 adjacent thereto, vertically.

The energy bandgap of the basal layer k1, or k2 can be the same or smaller than the energy bandgap of the hole injection layer or the electron injection layer. And, the energy bandgap of the basal layers k1, or k2 can be greater than the energy bandgap of the quantum wells W1, or W2 of the active layer 130.

The interfacial layer 310-3 can have composition of $Al_xIn_yGa_{1-x-y}N$ (Where, $0 \leq x,y \leq 1$). With regard to aluminum contents in the interfacial layer 310-4, aluminum contents of barrier layers can be the smaller as the barrier layers are the closer to the active layer 130. For an example, the aluminum content of the second barrier layer N2' can be smaller than the aluminum content of the first barrier layer N1'. And, the aluminum content of the third barrier layer N3' which is closest to the active layer 130 can be below 10%. And, an indium In content can be the greater as the barrier layers are the closer to the active layer.

And, the basal layers k1, k2 can have composition of $In_xGa_{1-x}N$ doped with p type impurity.

Each of the barrier layers N1',N2',N3' can have a thickness of at least 2 nm~10 nm. If each of the barrier layers N1',N2', N3' has a too thin thickness, each of the barrier layers N1', N2',N3' can not serve as a barrier against the hole adequately due to a tunneling effect. And, if each of the barrier layers N1',N2',N3' has a too thick thickness, each of the barrier layers N1',N2',N3' can act as an obstacle even for passing of the electron.

Since the aluminum content of the third barrier layer N3' is lower than the aluminum contents of other barrier layers N1', N2', defects caused by a difference of lattice constants between two layers at an interface of the active layer 130 and the third barrier layer N3' can be suppressed.

And, since the aluminum contents decrease as the barrier layers N1',N2',N3' go from the first barrier layer N1' to the third barrier layer N3' the more, leakage of the electrons from the active layer 130 to the hole injection layer 140 can be prevented.

Since the aluminum content of each of the barrier layers N1',N2',N3' increases linearly as each of the barrier layers N1',N2',N3' goes from the starting point to the end point the more, the embodiment can increases hole injection efficiency injected from the hole injection layer 140 to the active layer 130.

And, in comparison to the embodiment in FIG. 11, since the embodiment in FIG. 13 has greatest values of the energy bandgaps of the barrier layers which become smaller gradually, mobility of the holes emigrating from the hole injection layer 140 to the active layer 130 can become the greater relatively, making uniform distribution of the holes in a plurality of wells W1 to W4 in the active layer 130, light emitting efficiency and reliability of the light emitting device can be improved.

Figure 14:
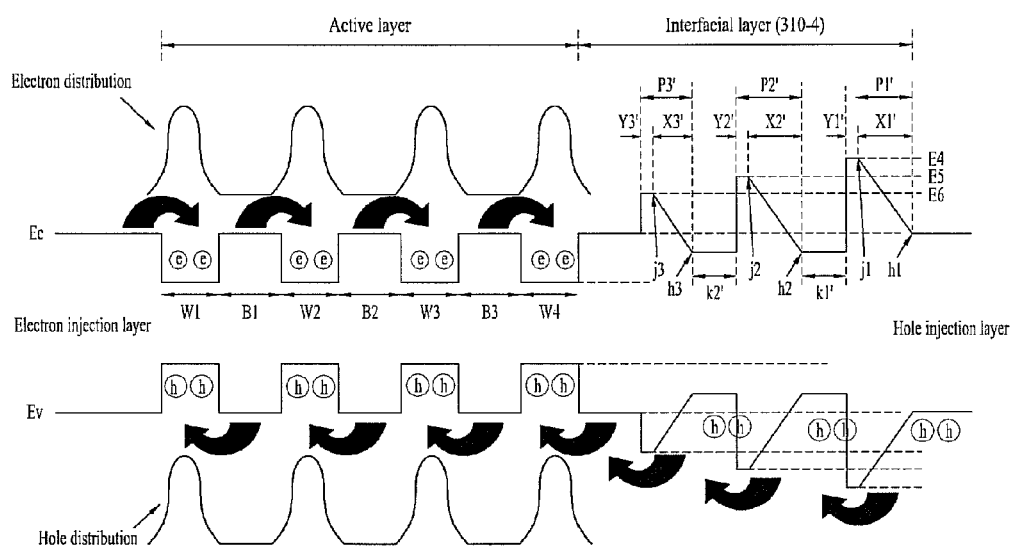
FIG. 14 illustrates a diagram of an energy bandgap of the light emitting device in FIG. 10 in accordance with another embodiment.

FIG. 14 illustrates a diagram of an energy band gap of the light emitting device 300 in FIG. 10 in accordance with another embodiment. Parts identical to the embodiment disclosed in FIG. 13 will have identical reference symbols, and repetitive description thereof will be omitted. In order to make distinctive from other embodiments, the interfacial layer having the energy bandgap shown in FIG. 14 is given a reference numeral of "310-4".

Though the interfacial layer 310-4 is similar to the interfacial layer 310-3, each of the barrier layers P1', P2', P3' has a first section x1', x2', or x3' in which the energy bandgap increases linearly, and a second section y1', y2', or y3' in which a greatest energy bandgap of the first section is fixedly maintained.

In detail, the interfacial layer 310-4 includes two or more than two barrier layers P1' to Pn' (Where, n is a natural numeral greater than 1), and basal layers k1', k2' arranged between adjacent barrier layers P1' and P2', P2' and P3'. Each of the barrier layers P1' to Pn' (For an example, n=3) includes a first section x1', x2' or x3' and a second section y1', y2' or y3'. For an example, the first barrier layer P1' can include the first section x1' and the second section y1'.

The first section x1', x2' or x3' is a section in which the energy bandgap increases from a starting point h1, h2 or h3 to an end point j1, j2 or j3 linearly or non-linearly, and the second section y1, y2 or y3 can be a section in which the energy bandgap E4, E5, or E6 of the end point j1, j2 or j3 is fixedly maintained.

As the barrier layers are the closer to the active layer 130, greatest energy bandgaps thereof can become the smaller. That is, as the end points are the closer to the active layer 130, the energy bandgaps thereof can be the smaller. For an example, the energy bandgap at the second end point j2 can be smaller than the energy bandgap at the first end point j1, and the energy bandgap at the third end point j3 can be smaller than the energy bandgap at the second end point j2.

And, as the second sections of the barrier layers are the closer to the active layer 130, the energy bandgaps thereof can be the smaller.

The basal layers k1', k2' can be sections of which energy bandgaps are lowest in the interfacial layer 310-4, and, though the energy bandgaps of the basal layers k1, k2 can be identical to each other, but not limited to this.

The barrier layers P1', P2', P3' act as vertical barriers against electrons injected into the active layer 130 from the first conductive type semiconductor layer 110. And, since greatest values of the energy bandgaps of the barrier layers decrease gradually, making mobility of the holes emigrating from the hole injection layer 140 to the active layer 130 greater relatively, light emitting efficiency of the light emitting device can be improved.

Figure 15:
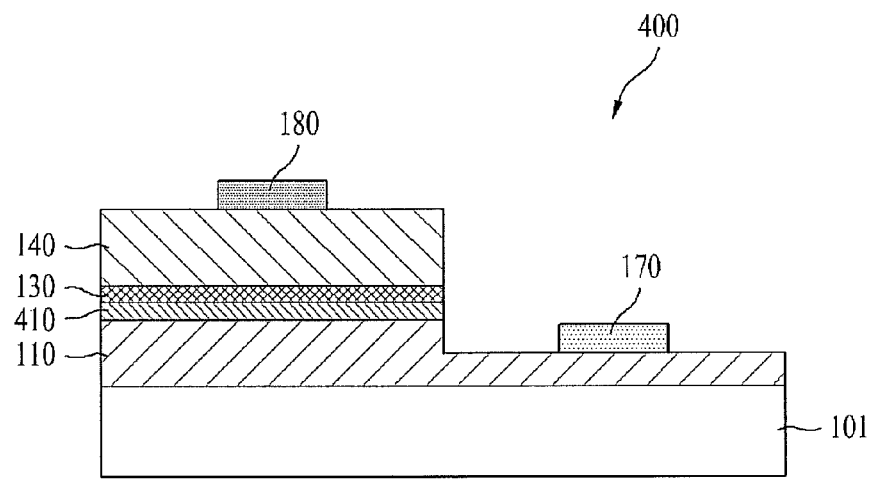
FIG. 15 illustrates a section of a light emitting device in accordance with another embodiment.
Figure 16:
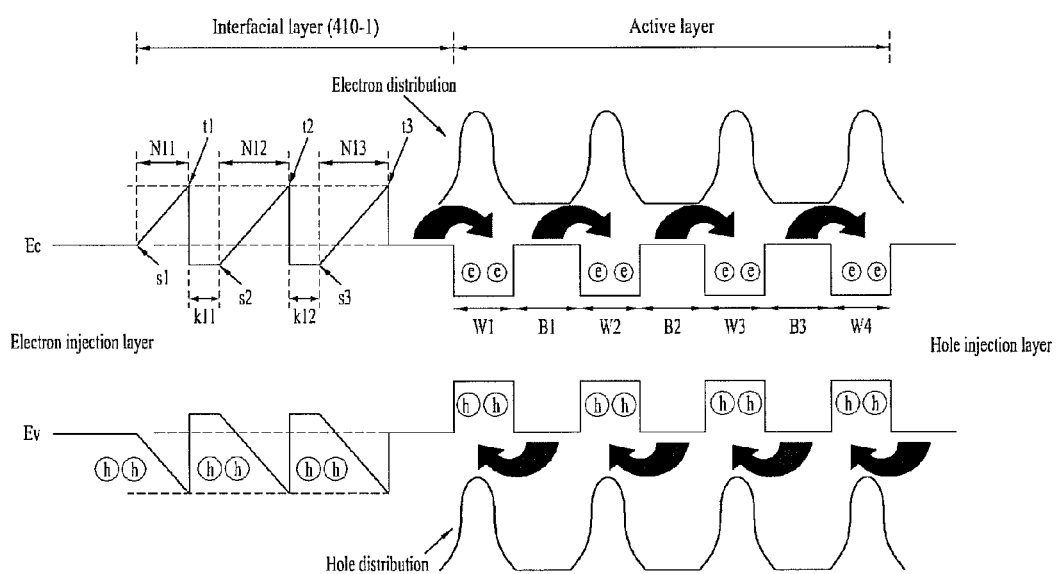
FIG. 16 illustrates a diagram of an energy bandgap of the light emitting device in FIG. 15 in accordance with a embodiment.

FIG. 15 illustrates a section of a light emitting device 400 in accordance with another embodiment, and FIG. 16 illustrates a diagram of an energy band gap of the light emitting device 400 in FIG. 15. Parts identical to the embodiment disclosed in FIG. 1 will have identical reference symbols, and repetitive description thereof will be omitted. In order to make distinctive, the interfacial layer having the energy bandgap shown in FIG. 16 will have a reference numeral of "410-1".

Referring to FIGS. 15 and 16, the light emitting device 400 includes a substrate 101, a first conductive type semiconductor layer 110, an interfacial layer 410, an active layer 130, a second conductive type semiconductor layer 140, a first electrode 170, and a second electrode 180.

The first conductive type semiconductor layer 110, the interfacial layer 410, the active layer 130, and the second conductive type semiconductor layer 140 can be arranged on the substrate 101 in succession. The interfacial layer 410-1 can be arranged between the first conductive type semiconductor layer 110 and the active layer 130.

The interfacial layer 410-1 can include a plurality of barrier layers N11 to N1n (Where, n is a natural numeral greater than 1) and basal layers, for an example, k11, k22 provided between the barrier layers N11 to N1n, for an example, n=3. For an example, the interfacial layer 410-1 can include three barrier layers N11, N12, N13 and two basal layers k11, k12.

The basal layers k11, k12 are provided between adjacent barrier layers N11 and N12, N12 and N13, and have fixed energy bandgaps which are smallest in the interfacial layer 410-1, respectively.

The energy bandgap of each of the barrier layers N11, N12, N13 can increase in a direction from the first conductive semiconductor layer 110 to the active layer 130, linearly or non-linearly. And, greatest energy bandgaps of the barrier layers N11, N12, N13 are different from one another, and can be the smaller as the barrier layers N11, N12, N13 are the closer to the active layer 130.

And, the barrier layer N11, N12 or N13 is defined from a starting point, for an example, s1, s2 or s3 to an end point, for an example, t1, t2 or t3, and the energy bandgap of the barrier layer N11, N12 or N13 can increase from the starting point s1, s2 or s3 to the end point t1, t2 or t3, linearly, or non-linearly. The energy bandgap in the interfacial layer 410-1 can decrease from the end point t1, t2 or t3 to the basal layer k11 or k12, vertically.

The basal layer k11 or k12 can have composition of $In_xAl_yGa_{1-x}$ doped with n type dopant. In this instance, x can be a value greater than 0 and smaller than 1. Since the basal layers k11, k12 are provided for smooth emigration of the electrons injected into the active layer 130 from the first conductive semiconductor layer 110, each of the basal layers k11, k12 can have a more than 1 nm section having a fixed energy bandgap between the barrier layers. That is, each of the basal layers k11, k12 can have a thickness greater than 1 nm. The basal layers k11, k12 can have small amounts of aluminum added thereto in a fabrication process, respectively.

In detail, the interfacial layer 410-1 can include first to third barrier layers N11, N12, N13, and first to second basal layers k11 and k12.

In this instance, the first barrier layer N11 can have the energy bandgap increasing from the first starting point s1 in a first conductive semiconductor layer (for an example, an electron injection layer) direction to the first end point t1 in an active layer 130 direction, linearly. Though the first end point t1 of the first barrier layer N11 and a starting point of the first basal layer k11 are in contact with each other, the energy bandgap can decrease from the first end point t1 to the starting point of the first basal layer k11, vertically. The first basal layer k11 can be provided between the first end point t1 of the first barrier layer N11 and the second starting point s2 of the second barrier layer N12, and the end point of the first basal layer k11 can be in contact with the second starting point s2 of the second barrier layer N12.

The second barrier layer N12 can have an energy bandgap increasing from the second starting point s2 to the second end point t2, linearly. Though the second end point t2 and the starting point of the second basal layer k12 are in contact with each other, the energy bandgap can decrease from the second end point t2 to the second basal layer k12, vertically. The second basal layer k12 can be provided between the second end point t2 and the third starting point s3 of the third barrier layer N13, and the end point of the second basal layer k12 can be in contact with the third starting point s3 of the third barrier layer N13.

The third barrier layer N13 can have an energy bandgap increasing from the third starting point s3 to the third end point t3, linearly.

The energy bandgaps of the first to third barrier layers N11, N12, N13 can have identical patterns to one another. And, the energy bandgaps of the interfacial layer 410-1 at the first to third starting points s1 to s3 can be identical to one another, and the energy bandgaps of the interfacial layer 410-1 at the first to third end points t1 to t3 can be identical to one another.

And, the energy bandgap of each of the basal layers k11, k12 can be smaller than the energy bandgap of the first conductive semiconductor layer 110.

The interfacial layer 410-1 can have a thickness of over 2 nm, and composition of $Al_xIn_yGa_{1-x-y}N$ (Where, $0 \leq x, y \leq 1$).

If each of the first to third barrier layers N11, N12, N13 has a too thin thickness, each of the first to third barrier layers N11, N12, N13 can not serve as a barrier against the hole adequately due to a tunneling effect. And, if each of the first to third barrier layers N11, N12, N13 has a too thick thickness, since each of the first to third barrier layers N11, N12, N13 can act as an obstacle even for passing of the electron, each of the first to third barrier layers N11, N12, N13 can have a thickness of below 10 nm.

An aluminum content of each of the barrier layers N11, N12, N13 increases from the starting point to the end point within 30% of the composition, and an indium content can decrease.

For an example, the energy bandgap at the first starting point s1 of the first barrier layer N11 can be identical or smaller than the energy bandgap of the first conductive semiconductor layer 110.

This is because, if the energy bandgap of the first barrier layer N11 at the first starting point s1 is greater than the energy bandgap of the first conductive semiconductor layer 110, the first barrier layer N11 can act as a barrier against emigration of the electron from the first conductive semiconductor layer 110 to the active layer 130.

And, the energy bandgap of each of the end points t1, t2, t3 of the barrier layers N11 to N13 can be greater than the energy bandgap of each of the quantum walls B1 to B3 of the active layer 130. This is because, if the energy bandgap of each of the barrier layers N11, N12, N13 is smaller than the energy bandgap of each of the quantum walls B1 to B3 of the active layer 130, the barrier layers N11 to N13 can fail to block the hole passing from the active layer 130 to the first conductive semiconductor layer 110.

Figure 17:
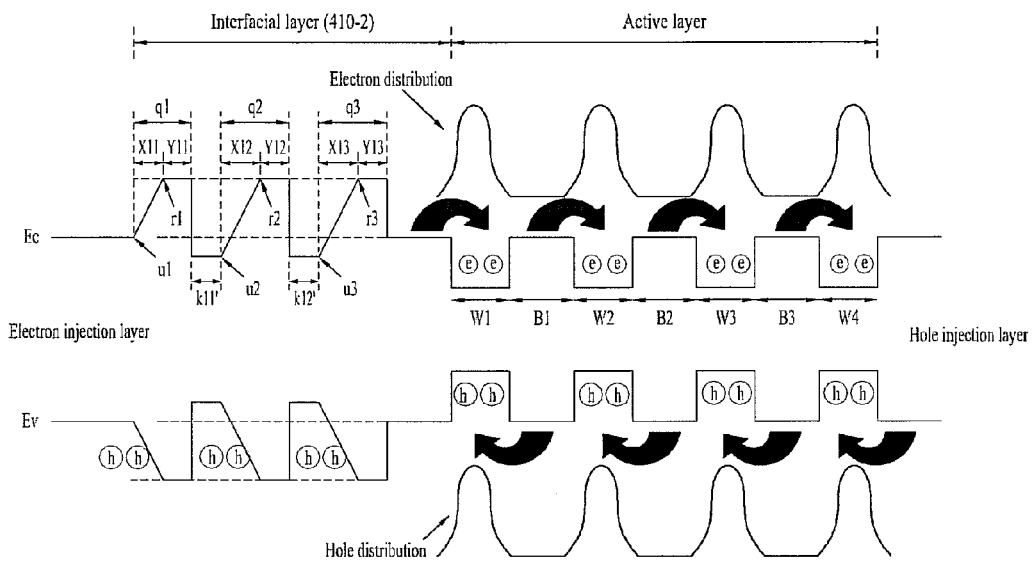
FIG. 17 illustrates a diagram of an energy bandgap of the light emitting device in FIG. 15 in accordance with another embodiment.

FIG. 17 illustrates a diagram of an energy band gap of the light emitting device 400 in FIG. 15 in accordance with another embodiment. In order to make distinctive, the interfacial layer having the energy bandgap shown in FIG. 17 will have a reference numeral of "410-2".

Referring to FIG. 17, the interfacial layer 410-2 includes two or more than two barrier layers q1 to qn (Where, n is a natural numeral greater than 1), and basal layers k11', k12' arranged between adjacent barrier layers q1 and q2, q2 and q3.

Each of the barrier layers q1 to qn, for an example, n=3, includes a first section x11, x12, or x13 and a second section y11, y12, or y13. For an example, the first barrier layer q1 can include the first section x11 and the second section y11.

The first section x11, x12, or x13 can be a section in which the energy bandgap increases from a starting point u1, u2, or u3 to the end point r1, r2, or r3 of the barrier layer q1, q2 or q3, linearly, or non-linearly, and the second section y11, y12, or y13 can be a section positioned between the end point r1, r2, or r3 and the basal layer k11' or k12', and has the energy bandgap at the end point r1, r2, or r3 fixedly maintained.

The energy bandgap of the end point r1, r2, or r3 of the barrier layer q1, q2 or q3 in FIG. 17 can be smaller than the energy bandgap at the end point t1, t2, or t3 of the barrier layer N11, to N13 in FIG. 16. Therefore, in comparison to the embodiment in FIG. 16, greatest energy bandgap of the barrier layer q1, q2 or q3 in the interfacial layer 410-2 can be smaller, relatively.

Accordingly, the interfacial layer 410-2 acts as a vertical barrier against the hole injected from the second conductive type semiconductor layer 140 to the active layer 130. However, the interfacial layer 410-2 can increase mobility of the electron emigrating from the first conductive type semiconductor layer 110 to the active layer 130 owing to greatest value of the energy bandgap of each of the barrier layers which is smaller than the embodiment in FIG. 16 relatively for the electron.

Figure 18:
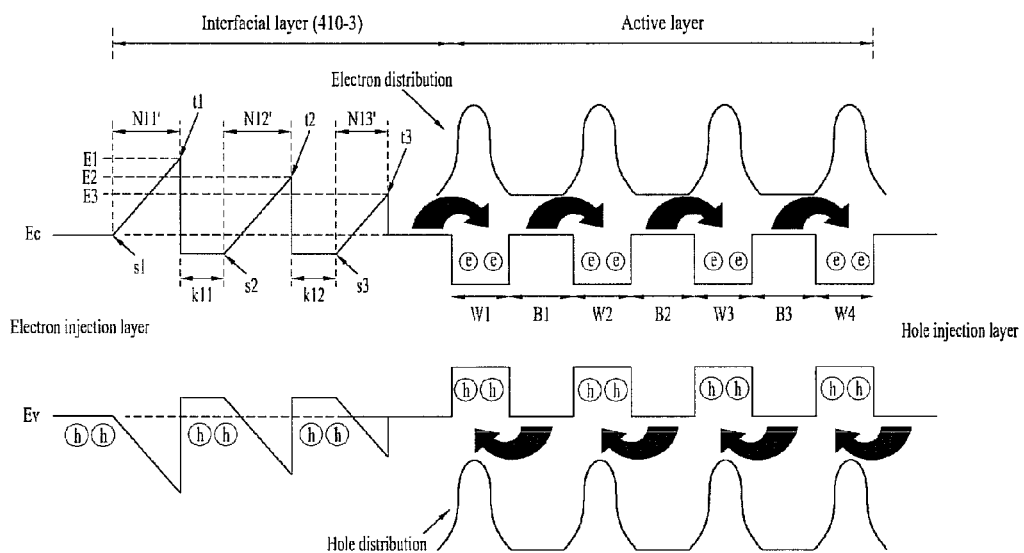
FIG. 18 illustrates a diagram of an energy bandgap of the light emitting device in FIG. 15 in accordance with another embodiment.

FIG. 18 illustrates a diagram of an energy band gap of the light emitting device 400 in FIG. 15 in accordance with another embodiment. In order to make distinctive, the interfacial layer having the energy bandgap shown in FIG. 18 will have a reference numeral of "410-3".

Though the interfacial layer 410-3 is similar to the interfacial layer 410-1, greatest energy bandgaps of the barrier layers N11', N12', N13' are different from one another, and the greatest energy bandgaps become the smaller as the barrier layer N11', N12', N13' are the closer to the active layer 130. That is, the energy bandgap at an end point t1, t2, or t3 of the barrier layer N11', N12', or N13' can be the smaller as the end point t1, t2, or t3 is the closer to the active layer 130.

The barrier layer N11', N12', or N13' is defined from a starting point, for an example, s1, s2, or s3 to an end point, for an example, g1, g2, or g3, and the energy bandgap of the barrier layer N11', N12', or N13' can increase from the starting point, for an example, s1, s2, or s3 to the end point, for an example, t1, t2, or t3, linearly. The end point, for an example, t1, t2, or t3 of the barrier layer N11, N12, or N13 is closer to the active layer 130 than the starting point s1, s2, or s3. And, the energy bandgap at the end point t1, t2, or t3 of the barrier layer N11', N12', or N13' can be the smaller as the end point t1, t2, or t3 is the closer to the active layer 130.

The interfacial layer 410-3 includes a plurality of barrier layers N11', N12', N13' and basal layers k11, k12 arranged between adjacent barrier layers. In this instance, the first barrier layer N11', the second barrier layer N12', and the third barrier layer N13' can be the closer to an electron injection layer in above order.

The energy bandgaps of the interfacial layer 410-3 can be the smaller as the end points are the closer to the active layer 130. For an example, the energy bandgap at the second end point t2 can be smaller than the energy bandgap at the first end point t1, and the energy bandgap at the third end point t3 can be smaller than the energy bandgap at the second end point t2.

And, the energy bandgaps at the starting points s1, s2, s3 of the barrier layers N11', N12', N13' can be the same with one another, but not limited to this.

And, the energy bandgap at each of the starting points s1, s2, s3 of the barrier layers N11', N12', N13' can be smaller than the energy bandgap of the electron injection layer.

The energy bandgap of each of the end points t1, t2, t3 of the barrier layers N11', N12', N13' can be greater than the energy bandgap of each of the quantum walls B1 to B3 of the active layer 130.

And, a lowest point of the energy bandgap of each of the barrier layers N11', N12', N13' can be higher than the energy bandgap of each of the wells W1 to W4 of the active layer 130. That is, the energy bandgap at each of the starting points s1, s2, s3 of the barrier layers N11', N12', N13' can be greater than the energy bandgap of each of the well layers W1 to W4.

The energy bandgaps of the interfacial layer 410-3 can decrease from one end point (For an example, t1) of one barrier layer (For an example, N11') to the basal layers, for an example, k11, adjacent thereto, vertically.

The interfacial layer 410-3 can have composition of $Al_xIn_yGa_{1-x-y}N$ (Where, $0 \leq x, y \leq 1$).

With regard to aluminum contents in the interfacial layer 410-3, aluminum contents of barrier layers can be the smaller as the barrier layers are the closer to the active layer 130. For an example, the aluminum content of the second barrier layer N12' can be smaller than the aluminum content of the first barrier layer N11'. And, the aluminum content of the third barrier layer N13' which is closest to the active layer 130 can be below 10%. And, an indium In content can be the greater as the barrier layers are the closer to the active layer 130.

And, the basal layers k11, k12 can have composition of $In_xGa_{1-x}N$ doped with p type impurity.

Each of the barrier layers N11', N12', N13' can have a thickness of at least 2 nm~10 nm. If each of the barrier layers N11', N12', N13' has a too thin thickness, each of the barrier layers N11', N12', N13' can not serve as a barrier which blocks emigration of the hole from the active layer 130 to the electron injection layer adequately due to a tunneling effect. And, if each of the barrier layers N11', N12', N13' has a too thick thickness, each of the barrier layers N11', N12', N13' can act as an obstacle even for passing of the electron from the active layer to the electron injection layer.

Since the aluminum content of the third barrier layer N13' is lower than the aluminum contents of other barrier layers N11', N12', defects caused by a difference of lattice constants between two layers at the interface of the active layer 130 and the third barrier layer N13' can be suppressed.

And, since the aluminum contents increase as the barrier layers N11', N12', N13' go from the third barrier layer N13' to the first barrier layer N11' the more, leakage of the holes from the active layer 130 to the electron injection layer can be prevented.

Since the aluminum content of each of the barrier layers N11', N12', N13' increases linearly as each of the barrier layers N11', N12', N13' goes from the starting point to the end point the more, the embodiment can increase electron injection efficiency injected from the electron injection layer to the active layer 130.

And, in comparison to the embodiment in FIG. 16, since the embodiment in FIG. 18 has greatest values of the energy bandgaps of the barrier layers which become the smaller gradually as the barrier layers go from the electron injection layer to an active layer direction the more, mobility of the holes emigrating from the electron injection layer 110 to the active layer 130 can become the greater relatively, making uniform distribution of the electrons in a plurality of wells W1 to W4 in the active layer 130, light emitting efficiency and reliability of the light emitting device can be improved.

Figure 19:
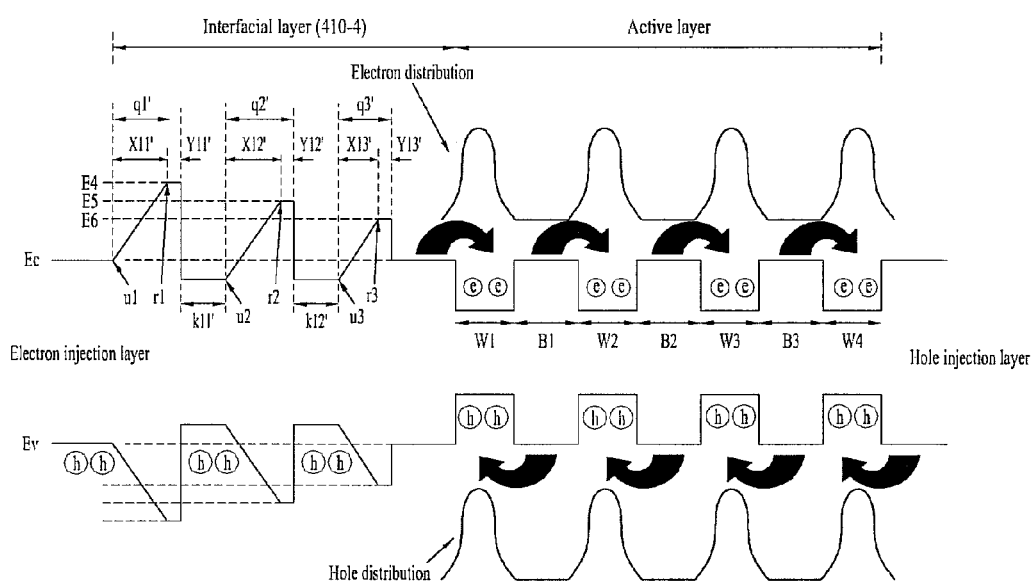
FIG. 19 illustrates a diagram of an energy bandgap of the light emitting device in FIG. 15 in accordance with another embodiment.

FIG. 19 illustrates a diagram of an energy band gap of the light emitting device 400 in FIG. 15 in accordance with another embodiment. In order to make distinctive from other embodiments, the interfacial layer having the energy bandgap shown in FIG. 19 will be given a reference numeral of "410-4".

Though the interfacial layer 410-4 is similar to the interfacial layer 410-3, each of the barrier layers q1', q2', q3' has a first section x11', x12', or x13' in which the energy bandgap increases, and a second section y11', y12', or y13' in which a greatest energy bandgap is fixedly maintained.

In detail, the interfacial layer 410-4 includes two or more than two barrier layers q1' to qn' (Where, n is a natural numeral greater than 1), and basal layers k11', k12' arranged between adjacent barrier layers q1' and q2', q2' and q3'.

Each of the barrier layers q1' to qn' (For an example, n=3) includes a first section x11', x12' or x13' and a second section y11', y12' or y13'. For an example, the first barrier layer q1' can include the first section x11' and the second section y11'.

The first section x11', x12' or x13' is a section in which the energy bandgap increases from a starting point u1, u2 or u3 to an end point r1, r2 or r3 linearly, or non-linearly, and the second section y1, y2 or y3 can be positioned between the first section x11', x12' or x13' and the basal layer k11', k12' and can be a section in which the energy bandgap at the end point r1, r2 or r3 is fixedly maintained.

In this instance, as the barrier layers are the closer to the active layer 130, greatest energy bandgaps thereof can become the smaller. That is, as the end points are the closer to the active layer 130, the energy bandgaps thereof can be the smaller. For an example, the energy bandgap at the second end point r2 can be smaller than the energy bandgap at the first end point r1, and the energy bandgap at the third end point r3 can be smaller than the energy bandgap at the second end point r2. And, as the second sections of the barrier layers are the closer to the active layer 130, the energy bandgap can be the smaller. Each of the basal layers k11', k12' can be a section of which energy bandgap is lowest in the interfacial layer 410-4.

Each of the barrier layers q1', q2', q3' acts as a vertical barrier against holes injected into the active layer 130 from the hole injection layer. And, since greatest values of the energy bandgaps of the barrier layers decrease gradually as the barrier layers are the closer to the active layer 130, making mobility of the electrons emigrating from the electron injection layer to the active layer 130 greater relatively, light emitting efficiency of the light emitting device can be improved.

Figure 9:
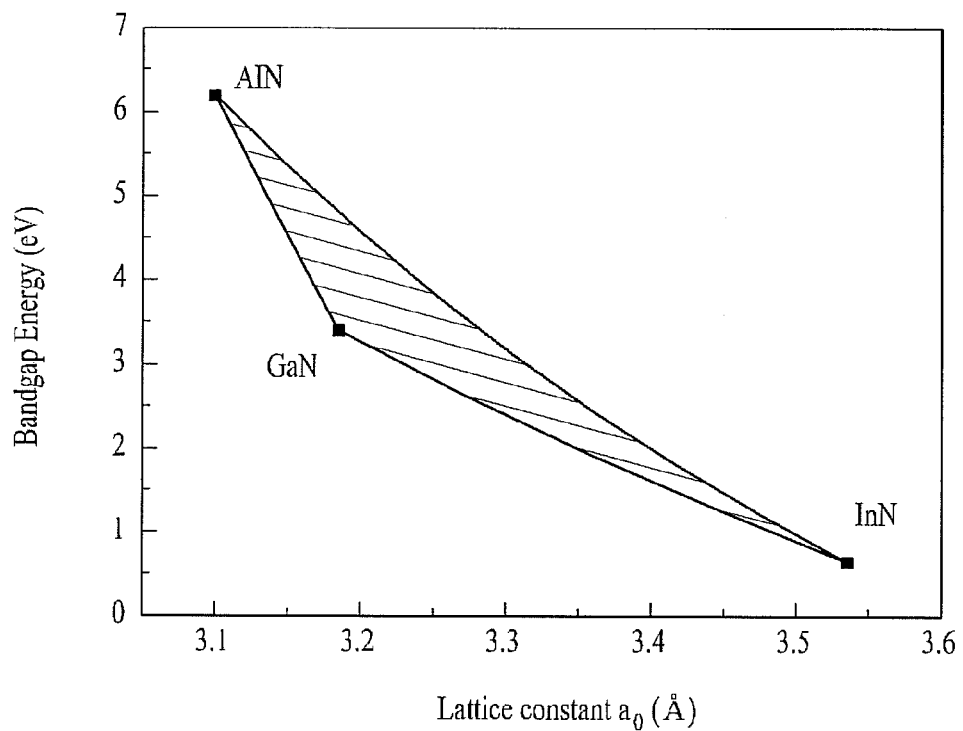
FIG. 9 illustrates a graph of an energy bandgap vs. a lattice constant of an interfacial layer in accordance with a embodiment.

FIG. 9 illustrates a diagram of an energy bandgap vs. a lattice constant of an interfacial layer 120, 210, 310, or 410 in accordance with a embodiment. Referring to FIG. 9, GaN has bandgap energy of 3.4 eV, and an in-plane lattice constant of 3.185 Å.

If the first conductive type semiconductor layer 110 and the second conductive type semiconductor layer 140 have composition of GaN, since composition of the interfacial layer 120, 210, 310, or 410 can be selected from an hatched region in FIG. 9, the interfacial layer 120, 210, 310, or 410 can have an energy bandgap of 0.8 eV 6.2 eV, and an in-plane lattice constant of 3.10 Å~3.54 Å.

Figure 20:
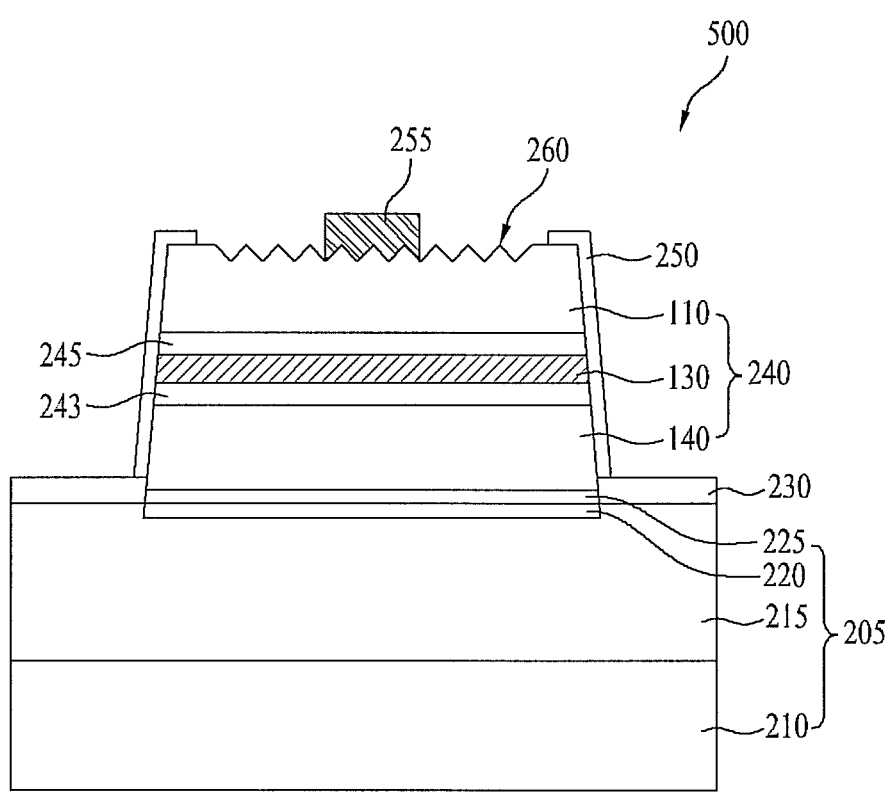
FIG. 20 illustrates a section of a light emitting device in accordance with another embodiment.

FIG. 20 illustrates a section of a light emitting device 500 in accordance with another embodiment. Referring to FIG. 20, the light emitting device 500 includes a light emitting structure 240 having a second electrode layer 205, a protective layer 230, a first conductive type semiconductor layer 110, an active layer 130, a second conductive type semiconductor layer 140, and an interfacial layer 243, 245, a passivation layer 250, and a first electrode 255.

The second electrode layer 205 is arranged on an underside of the second conductive type semiconductor layer 140, and includes a support substrate 210, a junction layer 215, a reflective layer 220, and an ohmic layer 225. The support substrate 210 supports the light emitting structure 240 and supplies power to the light emitting structure 240 together with the first electrode 255. The junction layer 215 is arranged on the support substrate 210. The junction layer 215 is in contact both with the reflective layer 220 and the ohmic layer 225 to make the reflective layer 220 and the ohmic layer 225 bonded to the support substrate 210.

The reflective layer 220 is arranged on the junction layer 215. The reflective layer 220 reflects a light from the light emitting structure 240 to improve light extraction efficiency. The ohmic layer 225 is formed on the reflective layer 220. The ohmic layer 225 is in ohmic contact with the second conductive type semiconductor layer 140 of the light emitting structure 240 for smooth supply of power.

The protective layer 230 is formed on the second electrode layer 205. The protective layer 230 can prevent an interface between the light emitting structure 240 and the junction layer 215 from peeling off, thereby reducing impaired reliability of the light emitting device 500.

The light emitting structure 240 is arranged on the second electrode layer 205.

The second conductive type semiconductor layer 140 can be arranged on the ohmic layer, the active layer 130 can be arranged on the second conductive type semiconductor layer 140, and the first conductive type semiconductor layer 110 can be arranged on the active layer 130.

The interfacial layer 243, 245 can be arranged between the second conductive type semiconductor layer 140 and the active layer 130, and/or between the first conductive type semiconductor layer 110 and the active layer 130.

In this instance, the interfacial layer 243 can be any one of the interfacial layers 210, 310-1 to 310-4 in one of the embodiments disclosed in FIGS. 6, and 11 to 14. And, the interfacial layer 245 can be any one of the interfacial layers 120, 410-1 to 410-4 in one of the embodiments disclosed in FIGS. 1, and 16 to 19.

The passivation layer 250 can be formed at a side of the light emitting structure 240 for protection of the light emitting structure 240 electrically, but not limited to this.

The first conductive type semiconductor layer 110 can have a top side with a roughness pattern 260 formed thereon for increasing light extraction efficiency. The first electrode 255 is arranged on the light emitting structure 240 in contact with the first conductive type semiconductor layer 110.

Figure 21:
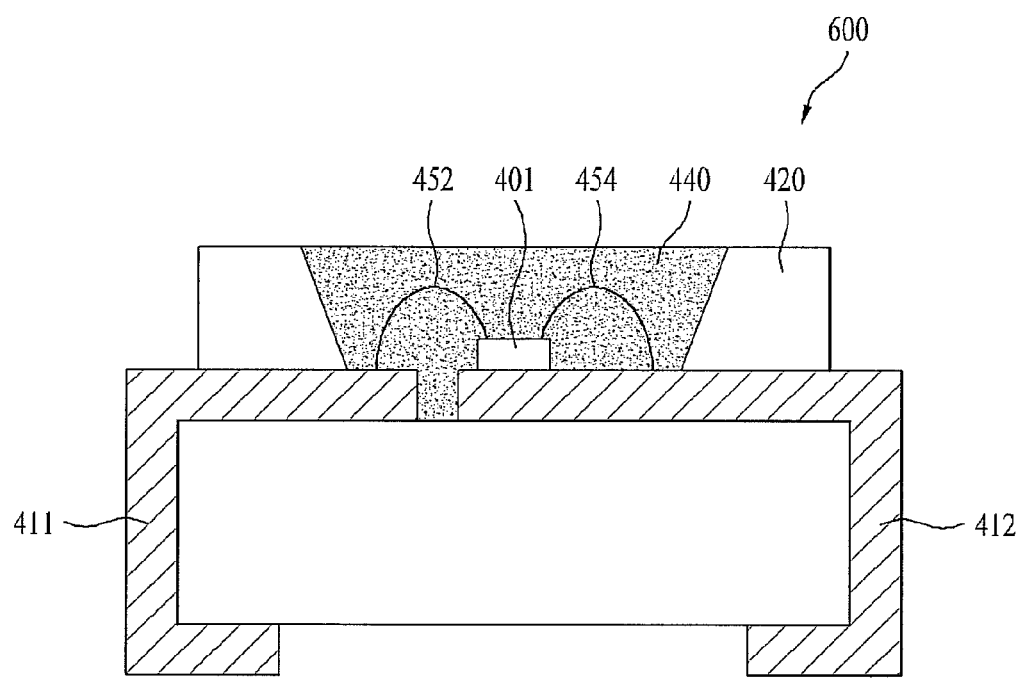
FIG. 21 illustrates a section of a light emitting device package having a light emitting device in accordance with a embodiment applied thereto.

FIG. 21 illustrates a section of a light emitting device package 600 in accordance with a embodiment. Referring to FIG. 21, the light emitting device package 600 includes a package body 420, a first electrode layer 411 and a second electrode layer 412 mounted to the package body 420, a light emitting device 401 mounted to the package body 420 and connected to the first electrode layer 411 and the second electrode layer 412 electrically, a filling material 440 for enclosing the light emitting device 401, a first wire 452 for connecting the light emitting device 401 to the first electrode layer 411 electrically, and a second wire 454 for connecting the light emitting device 401 to the second electrode layer 412, electrically.

The package body 420 can be formed of silicon, synthetic resin, or metal, and enhance the light extraction efficiency as there is a sloped surface formed around the light emitting device 401.

The first electrode layer 411 and the second electrode layer 412 are isolated from each other electrically, and provide power to the light emitting device 401. And, the first electrode layer 411 and the second electrode layer 412 can increase optical efficiency by reflecting the light from the light emitting device 401, and can dissipate heat from the light emitting device 401 to an outside of the light emitting device package.

The light emitting device 401 can be mounted on the package body 420, the first electrode layer 411, or the second electrode layer 412.

Though FIG. 20 illustrates the light emitting device 401 connected to the first electrode layer 411 and the second electrode layer 412 by wire electrically, a connection type thereof is not limited to this, but can be flip chip, or die bonding type.

The filling material 440 can enclose the light emitting device 401 to protect the same. And, the filling material 440 can have a fluorescent material included thereto for changing a wavelength of the light from the light emitting device 401. The light emitting device package can have at least one of the light emitting devices 100, 200, 300 disclosed in any one of the embodiments.

An array of the light emitting device packages of the embodiment can be on a substrate, and a light guide plate, a prism sheet, a diffusion sheet, and the like that are optical members can be arranged on a light path of the light emitting device package. The light emitting device package, the substrate, and the optical members can function as a lighting unit. As another embodiment, a display device, an indicating device, or a lighting system can be produced, which includes the semiconductor light emitting device or the light emitting device package described in the foregoing embodiments, and the lighting system can include, for an example, a lamp or a street light.

Figure 22:
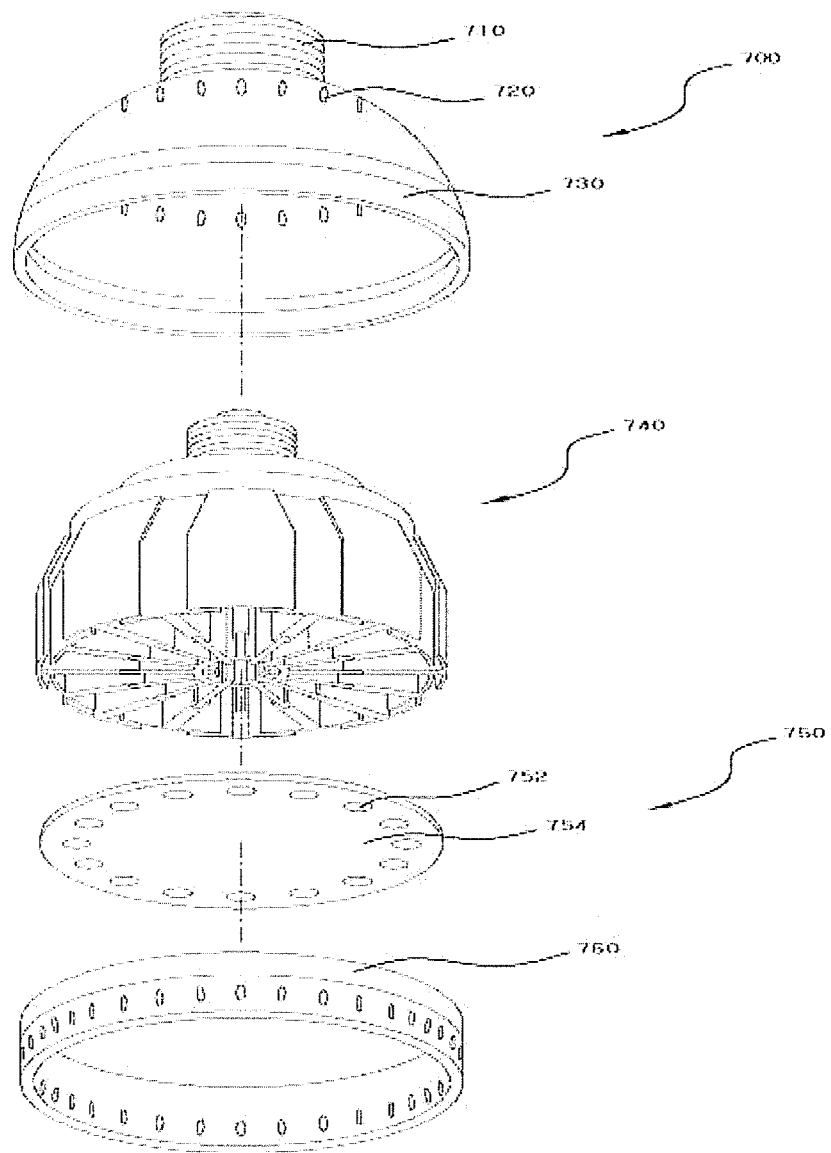
FIG. 22 illustrates an exploded perspective view of a lighting device having a light emitting device package in accordance with a embodiment applied thereto.

FIG. 22 illustrates an exploded perspective view of a lighting device having a light emitting device package in accordance with a embodiment. Referring to FIG. 22, the lighting device includes a light source 750 for projecting a light, housing 700 for housing the light source 750, a heat dissipating unit 740 for dissipating heat from the light source 750, and a holder 760 for fastening the light source 750 and the heat dissipating unit 740 to the housing 700.

The housing 700 includes a socket fastening portion 710 for fastening the housing 700 to an electric socket (not shown) and a body portion 730 connected to the socket fastening portion for housing the light source 750. The body portion 730 can have an air flow opening 720 passing therethrough.

The body portion 730 of the housing 700 has a plurality of air flow openings 720. The air flow opening 720 may be singular or plural arranged radially as shown in the drawing. Besides this, the arrangement of the air flow opening 720 can vary.

And, the light source 750 has a plurality of light emitting device packages 752 provided on a substrate 754. The substrate 754 can have a shape that can be placed in an opening of the housing 700, and can be formed of a material having high heat conductivity for transfer of heat to the heat dissipating unit 740, to be described later.

And, a holder 760 is provided under the light source, including a frame and another air flow openings. Though not shown, an optical member can be provided to a lower side of the light source 750 for causing the light from the light emitting device package 752 of the light source 750 to diverge, scatter, or converge. The lighting device of the embodiment uses the light emitting device package of the foregoing embodiments, for improving light emitting efficiency of the lighting device.

Figure 23:
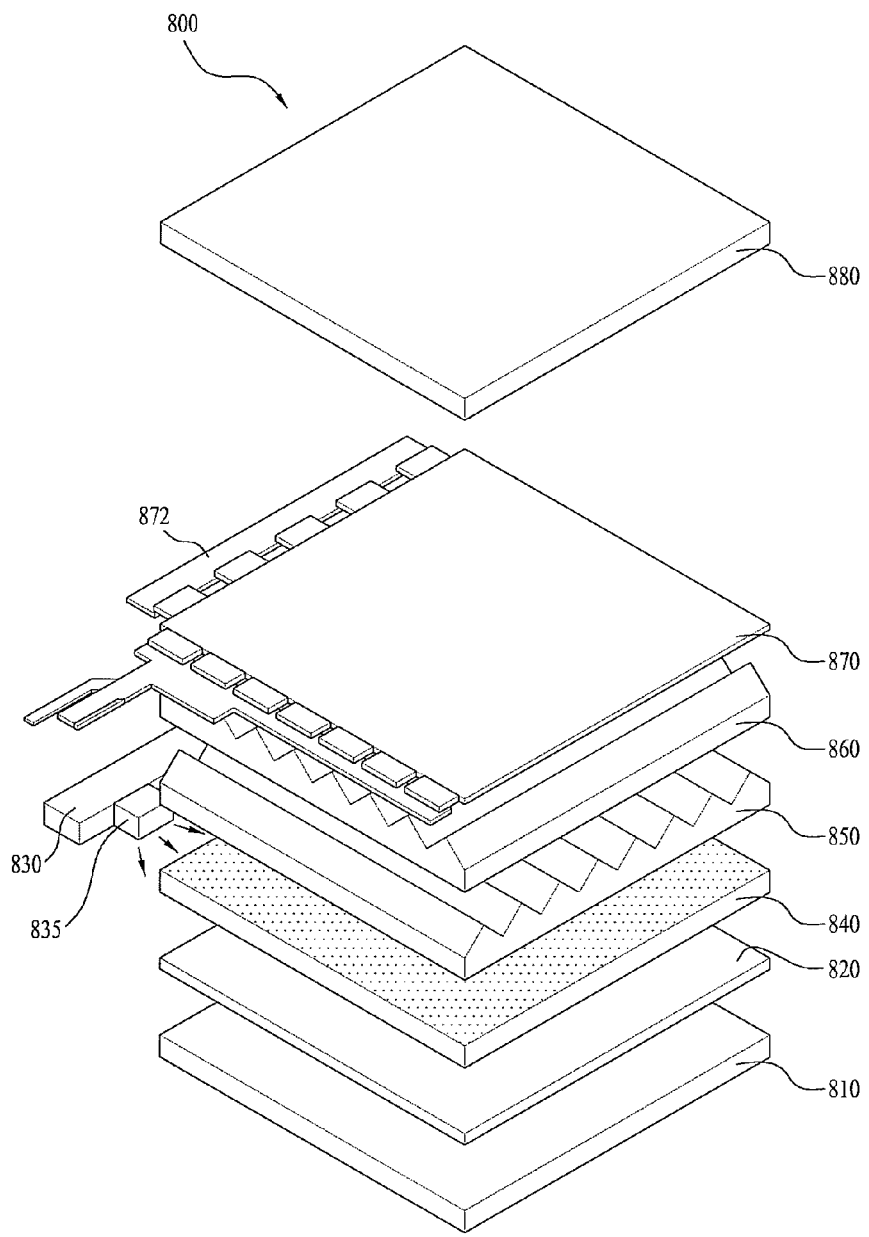
FIG. 23 illustrates an exploded perspective view of a display device having a light emitting device package in accordance with a embodiment applied thereto.

FIG. 23 illustrates an exploded perspective view of a display device having a light emitting device package in accordance with a embodiment applied thereto.

Referring to FIG. 23, the display device 800 includes a bottom cover 810, a reflective plate 820 on the bottom cover 810, a light source module 830 and 835 for emitting a light, a light guide plate 840 arranged in front of the reflective plate 820 for guiding the light from the light source module 830 and 835 to a front of the display device, optical sheets including prism sheets 850 and 860 arranged in front of the light guide plate 840, a display panel 870 arranged in front of the optical sheet, a picture signal forwarding circuit 872 connected to the display panel 870 for supplying a picture signal to the display panel 870, and a color filter 880 arranged in front of the display panel 870. In this instance, the bottom cover 810, the reflective plate 820, the light source module 830 and 835, the light guide plate 840, and the optical sheets can construe a backlight unit.

The light source module includes a light emitting device package 835 on a substrate 830. In this instance, the substrate 830 can be a PCB or the like, and the light emitting device package 835 can be one in FIG. 1.

The bottom cover 810 can accommodate elements of the display device 800. And, the reflective plate 820 can be an individual element as shown in the drawing, or can be a coat of a material with a high reflectivity on a rear of the light guide plate 840 or on a front of the bottom cover 810.

In this instance, the reflective plate 820 can be formed of a material which has high reflectivity and can form a micron-film, such as PET (PolyEthylene Terephtalate).

And, the light guide plate 830 scatters the light from the light source module for uniform distribution of the light to an entire region of a screen of the liquid crystal display panel. Accordingly, the light guide plate 830 is formed of a material having good refractivity and transmissivity, such as PolyMethylMethAcrylate PMMA, PolyCarbonate PC, or PolyEthylene PE.

And, the first prism sheet 850 can be formed of a polymer having light transmissivity and elasticity on one side of a supporting film. The polymer can have a prism layer with a plurality of three dimensional structures formed thereon, repeatedly. In this instance, as shown, the plurality of patterns can be a stripe type with repetitive ridges and grooves.

And, a direction of the ridges and the grooves in the second prism sheet 860 can be perpendicular to a direction of the ridges and the grooves in the first prism sheet 850, for uniform distribution of the light from the light source module and the reflective sheet to an entire surface of the display panel 870.

And, though not shown, each of the prism sheets can have a protective sheet provided thereon by providing a protective layer having light diffusing particles and a binder on both sides of the supporting film. And, the prism layer can be formed of a polymer material selected from a group having polyurethane, styrene butadiene copolymer, polyacrylate, polymethacrylate, polymethylmethacrylate, polyethyleneterephthalate elastomer, polyisoprene, and polysilicone.

And, though not shown, a diffusion sheet can be arranged between the light guide plate 840 and the first prism sheet 850. The diffusion sheet can be formed of a material selected from a polyester group and a polycarbonate group, for widening a light projection angle to the maximum by refraction and scattering of the light from the backlight unit. And, the diffusion sheet can include a supporting layer having light diffuser contained therein, and a first layer and a second layer both without the light diffuser contained therein formed on a light forwarding surface (a first prism sheet direction) and a light incident surface (a reflective sheet direction), respectively.

In the embodiment, the diffusion sheet, the first prism sheet 850 and the second prism sheet construe the optical sheet. The optical sheet can be constructed of other combination, for an example, a microlens array, a combination of the diffusion sheet and the microlens array, a combination of one prism sheet and the microlens array, or so on.

As the display panel 870, a liquid crystal panel can be applied, and besides the liquid crystal panel 860, other kind of display device which requires a light source can be applied. The display panel 870 has liquid crystals disposed between glass panels, and a polarizing plate placed on both of the glass panels for utilizing polarizability of a light. The liquid crystals have intermediate characteristics of liquid and solid, in which the liquid crystals, organic molecules with fluidity like the liquid, are arranged regularly like crystal. By utilizing a property of the liquid crystals in which a molecular arrangement varies with an external electric field, a picture is displayed.

The liquid crystal panel used in the display device has an active matrix system, in which a transistor is used as a switch for controlling a voltage supplied to pixels. And, the liquid crystal panel 870 has a color filter 880 on a front for each of pixels to transmit only red, green and blue lights of the light from the panel 870, thereby displaying a picture.

As has been described, the light emitting device package of the embodiment has the following advantages.

The display device of the embodiment uses the light source module having the light emitting device package of the embodiment, thereby improving the light emitting efficiency.

It will be apparent to those skilled in the art that various modifications and variations can be made in the embodiments without departing from the spirit or scope of the inventions. Thus, it is intended that the embodiments cover the modifications and variations of these embodiments provided they come within the scope of the appended claims and their equivalents.

What is claimed is:

1. A light emitting device comprising:
an active layer having quantum walls and quantum wells;
a first conductive type semiconductor layer on one side of the active layer;
a second conductive type semiconductor layer on the other side of the active layer; and
an interfacial layer arranged between the active layer and the first conductive type semiconductor layer or between the active layer and the second conductive type semiconductor layer;
wherein the interfacial layer includes barrier layers and basal layers provided between the barrier layers,
wherein an energy bandgap of each of the barrier layers increases from the first conductive type semiconductor layer or the second conductive type semiconductor layer to an active layer direction linearly, and greatest energy bandgaps of the barrier layers are different from one another.

2. The light emitting device as claimed in claim 1, wherein the greatest energy bandgaps of the barrier layers are the smaller as the barrier layers are the closer to the active layer.

3. The light emitting device as claimed in claim 1, wherein the greatest energy bandgap of each of the barrier layers is greater than the energy bandgap of each of the quantum walls.

4. The light emitting device as claimed in claim 1, wherein each of the barrier layers has a lowest point of an energy bandgap higher than an energy bandgap of each of the quantum walls.

5. The light emitting device as claimed in claim 1, wherein the basal layer is a section of the interfacial layer having a lowest energy bandgap.

6. The light emitting device as claimed in claim 1, wherein the basal layer has an energy bandgap identical or smaller than an energy bandgap of the first conductive type semiconductor layer or the second conductive type semiconductor layer.

7. The light emitting device as claimed in claim 6, wherein the basal layer has an energy bandgap greater than an energy bandgap of each of the quantum wells.

8. The light emitting device as claimed in claim 1, wherein each of the barrier layers includes;
a first section in which the energy bandgap increases linearly,
a second section in which the greatest energy bandgap of the first section is fixedly maintained.

9. The light emitting device as claimed in claim 1, wherein each of the barrier layers is defined from a starting point to an end point, and the energy bandgap of each of the barrier layers increases from the starting point to the end point, linearly.

10. The light emitting device as claimed in claim 9, wherein the basal layer is positioned between the end point of one of adjacent barrier layers and the starting point of the other one of the adjacent barrier layers.

11. The light emitting device as claimed in claim 10, wherein the energy bandgap decreases from one of the end points to the basal layer adjacent thereto, vertically.

12. The light emitting device as claimed in claim 9, wherein the energy bandgaps at the starting points of the barrier layers are identical to one another.

13. The light emitting device as claimed in claim 9, wherein the interfacial layer has composition of $Al_xIn_yGa_{1-x-y}N$ (Where, $0 \leq x, y \leq 1$), and an aluminum content of each of the barrier layers increases from the starting point to the end point, linearly.

14. The light emitting device as claimed in claim 13, wherein the aluminum content of the barrier layer closest to the active layer is below 10%.

15. The light emitting device as claimed in claim 1, wherein each of the barrier layers has a thickness of 1 nm~10 nm.

16. The light emitting device as claimed in claim 1, wherein the basal layer has composition of $In_xGa_{1-x}N$ doped with p type or n type impurity.

17. The light emitting device as claimed in claim 1, further comprising:
a substrate arranged on an underside of the first conductive type semiconductor layer;
a first electrode arranged on the first conductive type semiconductor layer; and
a second electrode arranged on the second conductive type semiconductor layer.

18. The light emitting device as claimed in claim 1, further comprising:
a first electrode on the first conductive type semiconductor layer; and
a second electrode arranged on an underside of the second conductive type semiconductor layer to include an ohmic layer and a reflective layer.

19. A light emitting device package comprising:
a package body;
a first electrode layer and a second electrode layer provided to the package body;
a light emitting device connected to the first electrode layer and the second electrode layer, electrically; and
a filling material for enclosing the light emitting device,
wherein the light emitting device includes;
an active layer having quantum walls and quantum wells,
a first conductive type semiconductor layer on one side of the active layer,
a second conductive type semiconductor layer on the other side of the active layer, and
an interfacial layer arranged between the active layer and the first conductive type semiconductor layer or between the active layer and the second conductive type semiconductor layer,
wherein the interfacial layer includes barrier layers and basal layers provided between the barrier layers,
wherein an energy bandgap of each of the barrier layers increases from the first conductive type semiconductor layer or the second conductive type semiconductor layer to an active layer direction linearly, and greatest energy bandgaps of the barrier layers are different from one another.

20. A display device comprising:
a display panel;
a backlight unit emitting a light to the display panel; and
an image signal forwarding circuit connected to the display panel for supplying an image signal thereto,
wherein the backlight unit includes;
a bottom cover,
a reflective plate arranged on the bottom cover,
a light guide plate arranged on the reflective plate,
a light source having light emitting device packages arranged on a substrate for emitting a light to the light guide plate, and
optical sheets arranged on the light guide plate,
wherein each of the light emitting device packages includes the light emitting device package as claimed in claim 19.

* * * * *